(12) United States Patent
McLaren et al.

(10) Patent No.: US 12,506,086 B2
(45) Date of Patent: Dec. 23, 2025

(54) MICROELECTRONIC PACKAGES HAVING COAXIALLY-SHIELDED RADIO FREQUENCY INPUT/OUTPUT INTERFACES

(71) Applicant: NXP USA, Inc., Austin, TX (US)

(72) Inventors: Roy McLaren, Gilbert, AZ (US); Joseph Agyemang Duah, Gilbert, AZ (US); Ramanujam Srinidhi Embar, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 411 days.

(21) Appl. No.: 17/667,894

(22) Filed: Feb. 9, 2022

(65) Prior Publication Data

US 2023/0253339 A1 Aug. 10, 2023

(51) Int. Cl.
*H01L 23/552* (2006.01)
*H01L 23/498* (2006.01)
*H01L 23/66* (2006.01)
*H03H 7/38* (2006.01)

(52) U.S. Cl.
CPC ...... *H01L 23/552* (2013.01); *H01L 23/49833* (2013.01); *H01L 23/49838* (2013.01); *H01L 23/66* (2013.01); *H03H 7/38* (2013.01); *H01L 2223/6627* (2013.01)

(58) Field of Classification Search
CPC ............. H01L 23/552; H01L 23/49833; H01L 23/49838; H01L 23/66; H01L 2223/6627; H01L 2223/6622; H01L 23/5384; H03H 7/38
USPC ....................................................... 257/659
See application file for complete search history.

(56) References Cited

U.S. PATENT DOCUMENTS

| 7,750,764 B2 | 7/2010 | Snodgrass et al. |
| 8,125,292 B2 | 2/2012 | Eppich et al. |
| 2003/0077924 A1* | 4/2003 | Shirasaki ............... H01L 23/66 439/68 |
| 2005/0178585 A1 | 8/2005 | Kim et al. |

(Continued)

FOREIGN PATENT DOCUMENTS

| CN | 103151327 A * | 6/2013 |
| JP | 2013211368 A * | 10/2013 |
| WO | 2006065539 A2 | 6/2006 |

OTHER PUBLICATIONS

Wartenberg, S.A. et al; "A Coaxial to Microstrip Transition for Multilayer Substrates"; IEEE Transactions on Microwave Theory and Techniques, vol. 52, Issue 2; 5 pages (Feb. 2004).

(Continued)

*Primary Examiner* — Norman D Richards
*Assistant Examiner* — Laura M Dykes

(57) ABSTRACT

Embodiments of a microelectronic package include a package body, radio frequency (RF) circuitry contained in the package body, and a topside input/output (I/O) interface formed on an exterior surface of the package body, and a coaxially-shielded RF interposer. The first coaxially-shielded RF interposer includes a dielectric interposer body, a first signal-carrying via electrically coupled to a topside signal terminal included in the topside I/O interface, and a first coaxial shield structure. The first coaxial shield structure is bonded to the dielectric interposer body, is electrically coupled to a first topside ground terminal further included in the topside I/O interface, and extends at least at least partially around an outer periphery of the signal-carrying via.

21 Claims, 10 Drawing Sheets

(56) References Cited

U.S. PATENT DOCUMENTS

2010/0213584 A1\* 8/2010 Ju .......................... H01L 23/057
                                                        257/E23.115
2018/0351595 A1\* 12/2018 Tarui ........................ H04B 1/38
2019/0159332 A1\* 5/2019 Ishibashi ................. H05K 1/021
2021/0233865 A1 7/2021 Tarui et al.
2023/0063808 A1\* 3/2023 Shahidi ................ H05K 3/0094

OTHER PUBLICATIONS

Ebadi, Siamak et al; "Wideband Coaxial to Substrate Integrated Waveguide Transition in a Multilayer Reconfigurable Antenna Configuration"; IEEE Antennas and Propagation Society International Symposium ; 2 pages (2014).

U.S. Appl. No. 17/136,304; not yet published, filed Dec. 29, 2020; 43 pages.

U.S. Appl. No. 17/335,077; not yet published, filed Jun. 1, 2021; 63 pages.

\* cited by examiner

MICROELECTRONIC PACKAGES HAVING COAXIALLY-SHIELDED RADIO FREQUENCY INPUT/OUTPUT INTERFACES

TECHNICAL FIELD

Embodiments of the present disclosure relate generally to microelectronics and, more particularly, to power amplifier packages and other microelectronic packages having coaxially-shielded radio frequency input/output interfaces.

BACKGROUND

By common design, a microelectronic package contains a package substrate, such as a multilayer printed circuit board (PCB), to which integrated circuit (IC) dies and other components are attached. Such IC dies may include, for example, one or more power transistor dies when the microelectronic package contains power amplifier (PA) circuitry utilized to amplify radio frequency (RF) signals. Depending upon the power levels and frequencies of the power transistor dies, as well as the die technology employed, such power transistor dies may be prone to excess heat generation during package usage. If not adequately dissipated, such excess heat can accumulate within the microelectronic package interior and limit performance of the power transistor dies. For at least this reason, various package architectures have been developed for enhancing the dissipation of excess heat generated during the operation of power transistor dies, and possibly other components, within a given microelectronic package. While useful for enhancing package thermal performance, such package architectures often provide little benefit to the electrical performance aspects of the package, which may also degrade at higher power levels and operational frequencies. Degradations in electrical performance may occur due to undesired electromagnetic (EM) coupling between RF signal conductors, such as input-output coupling, particularly as RF packages grow smaller in size. An ongoing demand thus persists for microelectronic packages enabling further optimization of thermal and electrical performance characteristics of a given microelectronic package, while also promoting package miniaturization and design flexibility.

BRIEF DESCRIPTION OF THE DRAWINGS

At least one example of the present invention will hereinafter be described in conjunction with the following figures, wherein like numerals denote like elements, and.

Figure 1:
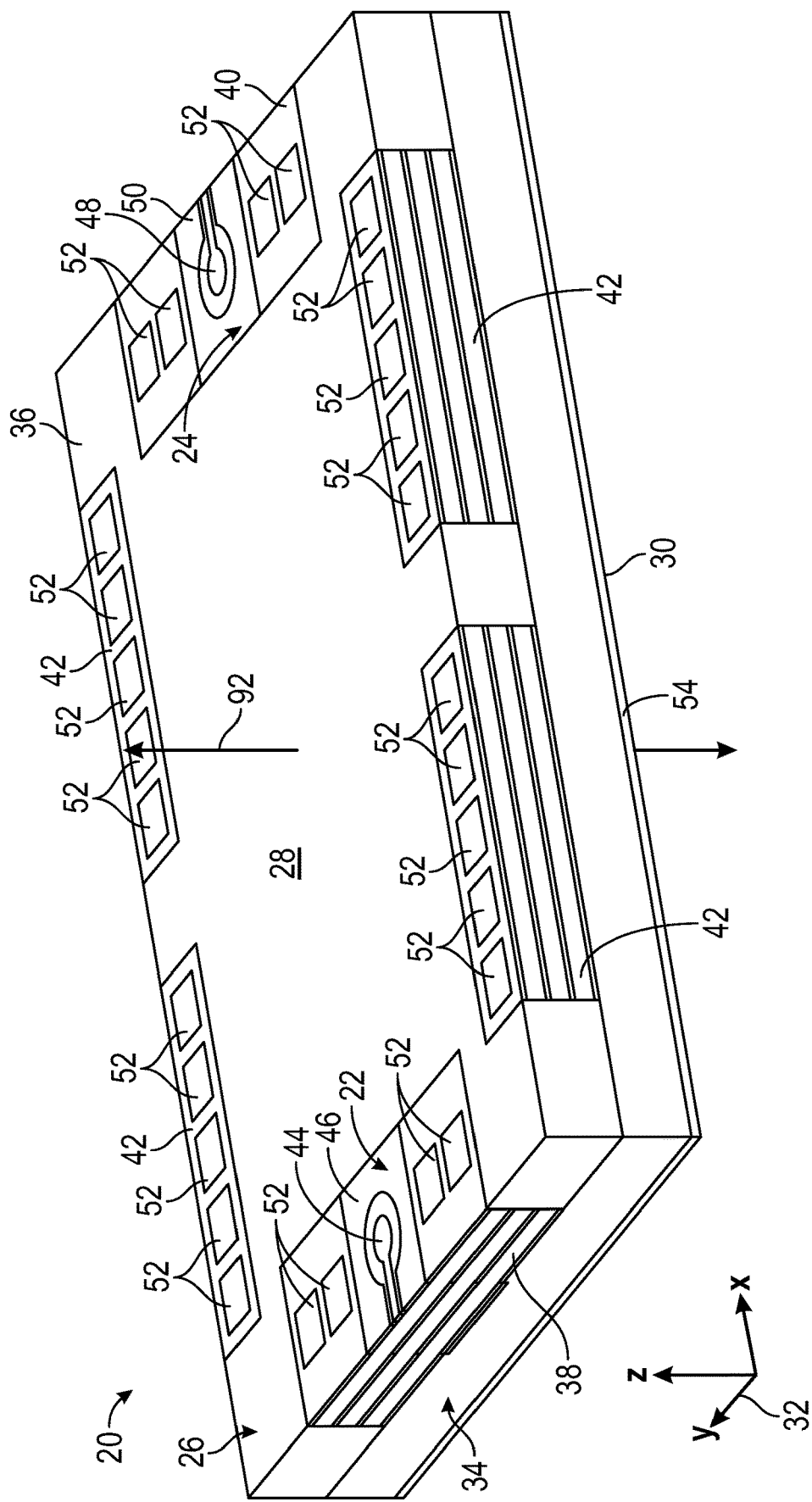
FIGS. 1 and 2 are top and bottom isometric views, respectively, of a microelectronic package including a coaxially-shield radio frequency (RF) input/output (I/O) interface implemented utilizing one or more interposer pieces, as illustrated in accordance with an example embodiment of the present disclosure.

For simplicity and clarity of illustration, descriptions and details of well-known features and techniques may be omitted to avoid unnecessarily obscuring the example and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

Embodiments of the present disclosure are shown in the accompanying figures of the drawings described briefly above. Various modifications to the example embodiments may be contemplated by one of skill in the art without departing from the scope of the present invention, as set-forth the appended claims.

As appearing throughout this document, the term "package" encompasses the term "module." By extension, the terms "microelectronic package" and "power amplifier package" encompass the terms "microelectronic module" and "power amplifier module," respectively. As further appearing herein, the term "metallic" refers to a material principally composed of at least one metal constituent, by weight. Similarly, reference to a material as composed of a particular metal, such as aluminum (Al), copper (Cu), or nickel (Ni), indicates that the material is predominately composed of the named metal by weight, but may contain lesser amounts of other metallic or non-metallic constituents. The terms "input/output interface" and "I/O interface," as still further appearing herein, refer to a terminal-containing interface containing at least one signal input terminal, at least one signal output terminal, or a combination thereof. A given I/O interface may be more specifically referred to as a radio frequency (RF) I/O interface when containing at least one RF signal input or output terminal.

Overview

Microelectronic packages including coaxially-shielded RF I/O interfaces are disclosed. Generally, the below-described coaxially-shielded RF I/O interfaces reduce the susceptibility of microelectronic packages to electromagnetic interference (EMI) arising from undesired coupling of EMI emission sources (e.g., transmission lines carrying different RF signals) within and external to the package. Through the integration of such coaxially-shielded RF I/O interfaces, various electrical performance aspects of microelectronic packages, such as signal-to-noise ratios, may be rendered more consistent or otherwise enhanced across different applications and usage of the package with system-level substrates (e.g., motherboards) of varying designs. For example, embodiments of the coaxially-shielded RF I/O interface may help suppress RF leakage and coupling effects, undesired evanescent modes, higher order modes, and parallel plate (stripline) modes, which may otherwise occur in the context of conventional package designs containing unshielded or poorly shielded RF I/O interfaces. Moreover, embodiments of the coaxially-shielded RF I/O interface are well-suited for integration into high thermal performance (HTP) microelectronic packages; that is, microelectronic packages including topside I/O interfaces in combination with opposing bottomside thermal interfaces through which excess heat is extracted to cool packaged RF circuitry (e.g., power amplifier dies) or otherwise dissipate excess heat generated during package operation. In such embodiments, the bottomside thermal interface may assume the form of one or more metallic surfaces accessible from (and perhaps coplanar with) the package backside surface and located opposite the package topside surface, as taken in a package thickness or height direction. As described more fully below, HTP packages may provide enhanced thermal and electrical performance aspects across a range of applications or usages, including when a given microelectronic package is operated at higher RF power levels or frequencies and/or when a given package contains RF power dies fabricated utilizing layered gallium nitride (GaN) substrates or other power dense die technologies.

Embodiments of the below-described coaxially-shielded RF I/O interface are conveniently implemented utilizing one or more interposer pieces. For example, in certain embodiments, the coaxially-shielded RF I/O interface may include a first interposer piece defining a coaxially-shielded RF input and a second interposer piece defining a coaxially-shielded RF output. In such embodiments, the first interposer piece may be located adjacent (and perhaps may have a sidewall coplanar with) a first sidewall of the microelectronic package body, while the second interposer piece is located adjacent (and may include a sidewall coplanar with) a second, opposing sidewall of the package body. Additionally, the first and second interposer pieces may be spaced along an axis perpendicular to the package height direction, with any number of additional interposer pieces embedded in the package body at other locations; e.g., spaced about the perimeter of the package as viewed looking downwardly on the package topside. In other instances, a coaxially-shielded RF I/O interface may include both a coaxially-shielded RF input and a coaxially-shielded RF output, which are provided utilizing a single, larger interposer piece. In this latter case, the interposer piece may extend from a location adjacent a first package sidewall to a location adjacent a second, opposing package sidewall. The coaxially-shielded RF input and output may be formed in regions of the interposer piece adjacent the opposing package sidewalls to provide the desired spacing or standoff. Further, the interposer piece may be imparted with a U-shaped or ring-shaped planform (top-down) geometry and may extend along an outer periphery of the package body. In still other cases, a coaxially-shielded RF I/O interface may incorporate a different number of coaxially-shielded RF inputs or outputs, which may be implemented utilizing any practical number of interposer pieces varying in dimensions, geometry, and construction.

When the coaxially-shielded RF I/O interface is implemented utilizing one or more interposer pieces as just described, a given interposer piece may be leveraged to define other terminals contained in the topside I/O interface of the package. Such other topside terminals may provide connection to bias circuitry, to harmonic terminations, to direct current (DC) circuitry, or to other circuitry within the package. Embodiments of the coaxially-shielded RF I/O interface also support precise impedance matching through, for example, the fine tuning of transmission line widths at transitions between the package substrate, the coaxially-shielded RF I/O interface, and the system-level substrate on which the microelectronic package is installed. With respect to the package substrate, in particular, embodiments of the microelectronic package may incorporate a printed circuit board (PCB) having a populated frontside (also referred to as a "die support surface") to which RF circuitry components, such as at least one IC die bearing a field effect transistor (FET) or another transistor, are attached. So too may a given interposer piece be attached to the populated frontside of the PCB; and, during manufacture, may potentially be subject to overmolding forming a dielectric encapsulant portion of the package surrounding the packaged circuitry. For example, in such embodiments, a given interposer piece may include upper and lower interposer pads, which are formed on opposing surfaces of a dielectric interposer body. At least one signal-carrying via may be embedded within the dielectric interposer body such that the signal-carrying via (e.g., conducting an RF input signal or an RF output signal) extends between, and therefore electrically couples, the upper and lower interposer bond pads. The upper interposer bond pad may be exposed along the package topside surface, and perhaps may be substantially coplanar therewith, to define an RF signal (input or output) terminal of the microelectronic package. Comparatively, the lower interposer bond pad may be bonded to a substrate bond pad on the package PCB to attach the interposer piece to the populated surface of the PCB, while a substrate transmission line extends from the substrate bond toward the packaged RF circuitry to electrically couple the circuitry to the upper interposer bond pad through the interposer piece. In other instances, the electrical connection between the lower interposer bond pad and the packaged RF circuitry may be established in another manner.

When present within the microelectronic package, a given interposer piece may include a layered or non-layered dielectric interposer body, any number of upper and lower interposer pads (e.g., formed by patterning metallic layers), and vertically-extending conductors or vias electrically coupling corresponding pairs or groups of upper and lower interposer pads. Examples of such vertically-extending conductors include filled or plated vias, which extend within the dielectric body of an interposer piece; the term "via," as appearing herein, referring to an electrical conductor extending principally in a package thickness or height direction (herein, synonymous with the term "vertical"). Often, the vertically-extending vias may be formed as openings extending within a dielectric interposer body, which have plated internal surfaces, which are backfilled with an electrically-conductive material, or which otherwise contain an electrically-conductive material sufficiently distributed to provide the desired electrical interconnections between upper and lower interposer pads. Comparatively, the dielectric body of a given interposer piece may be composed of a PCB material (e.g., FR-4), a ceramic, or another dielectric material in or on which such vias may be formed. The dielectric interposer body may be formed as non-layered monolithic structure (e.g., a ceramic, polymeric, or composite block), as a multilayer (e.g., PCB) structure, or as any other structure capable of serving as a dielectric substrate in or on which the interposer pads, the electrically-conductive vias, and any other electrically-conductive features of the interposer pieces are suitably formed. In alternative embodiments, the coaxially-shielded RF I/O interface may be produced without incorporating such interposer pieces. For example, depending upon dimensional tolerances and the manufacturing approach employed, freestanding metallic pieces may be bonded to the package PCB (or other package substrate) utilizing an electrically-conductive bonding material and potentially subject to process steps (e.g., overmolding and back-grinding) to produce a package having a coaxially-shielded RF I/O interface of the type described herein.

When the coaxially-shielded RF I/O interface is implemented utilizing an interposer piece, the interposer piece may include, among other features, a dielectric interposer body in which a first signal-carrying via extends to transmit an RF input or an RF output signal during package operation. Again, the signal-carrying via may extend in the dielectric interposer body in essentially a package height (vertical) direction or interposer thickness direction, with the packaged circuitry electrically coupled to at least a first topside ground terminal of the package through the signal-carrying via. In such embodiments, a coaxial shield structure may also be embedded in or otherwise joined to the dielectric interposer body and electrically coupled to the topside ground terminal. The coaxial shield structure is further sized and shaped to extend at least partially around, or to partially circumscribe, an outer periphery of the signal-carrying via. In this regard, and as a first example, the coaxial shield structure may extend at least partially around the first signal-carrying via when containing at least three (e.g., grounded) vias angularly spaced around the signal-carrying via in a generally circular or semicircular cage-like array, which is substantially coaxial or concentric with signal-carrying via and which spans a minimum of a 90 degree) (° angular range taken about the longitudinal axis or length of the signal-carrying via. Similarly, as a second example, a coaxial shield structure may extend at least partially around the first signal-carrying via when containing at least one ground plane layer (defined by a patterned metal layer within the interposer piece) having an opening through which signal-carrying via passes, while bound by a continuous or unbroken edge of the ground plane layer extending around the via to span a minimum of a 90° arc or angular range. In many instances, the coaxial shield structure may include an electrically-grounded via cage, at least one ground plane layer, or a combination of such features, which span an angular (EMI shielding) range of at least 180° about an outer periphery of the signal-carrying via and, perhaps, provide full coaxial shielding extending entirely about the signal-carrying via by 360°. In so doing, embodiments of the below-described coaxial shield structure emulate the outer shielding of a coaxial cable to reduce the susceptibility of the signal-carrying via (e.g., an RF input or output via) to EMI and optimize the electrical performance of the microelectronic package. This may be particularly beneficial in the context of certain microelectronic packages, such as power amplifier (PA) packages containing power transistor dies, as further discussed below.

An example embodiment of a microelectronic package containing a coaxially-shielded RF I/O interface will now be described in connection with FIGS. 1-9. While described below in connection with a particular type of microelectronic package, namely a PA package having both coaxially-shielded RF input and output (e.g., realized utilizing one or more interposer pieces embedded in the dielectric encapsulant of a flat no-lead or land grid array (LGA) package), embodiments of the coaxially-shielded RF I/O interface can be readily incorporated into various microelectronic package types or formfactors, such as ball grid array (BGA) packages when a ball attach process is further performed. Additionally, while the below-described example coaxially-shielded RF I/O interface contains both a coaxial via cage and multiple vertically-spaced vertically-spaced ground plane layers, which surround or flank a given signal-carrying via over an angular range equal to or greater than 180° (and perhaps provide full 360° coaxial shielding of the signal-carrying via), alternative embodiments of the coaxially-shielded RF I/O interface may contain different structural features or arrangements, may omit any number of the below-described structural features, may vary in the angular EMI shielding range provided by the coaxial shield structure, or may otherwise differ from the examples set-forth below in conjunction with FIGS. 1-9. Further emphasizing this latter point, additional examples of interposer pieces, transmission lines, and associated structure features combining to yield alternative embodiments of the coaxially-shielded RF I/O interfaces are discussed below in connection with FIGS. 10-13.

Example Microelectronic Package Including a Coaxially-Shielded RF I/O Interface

Figure 2:
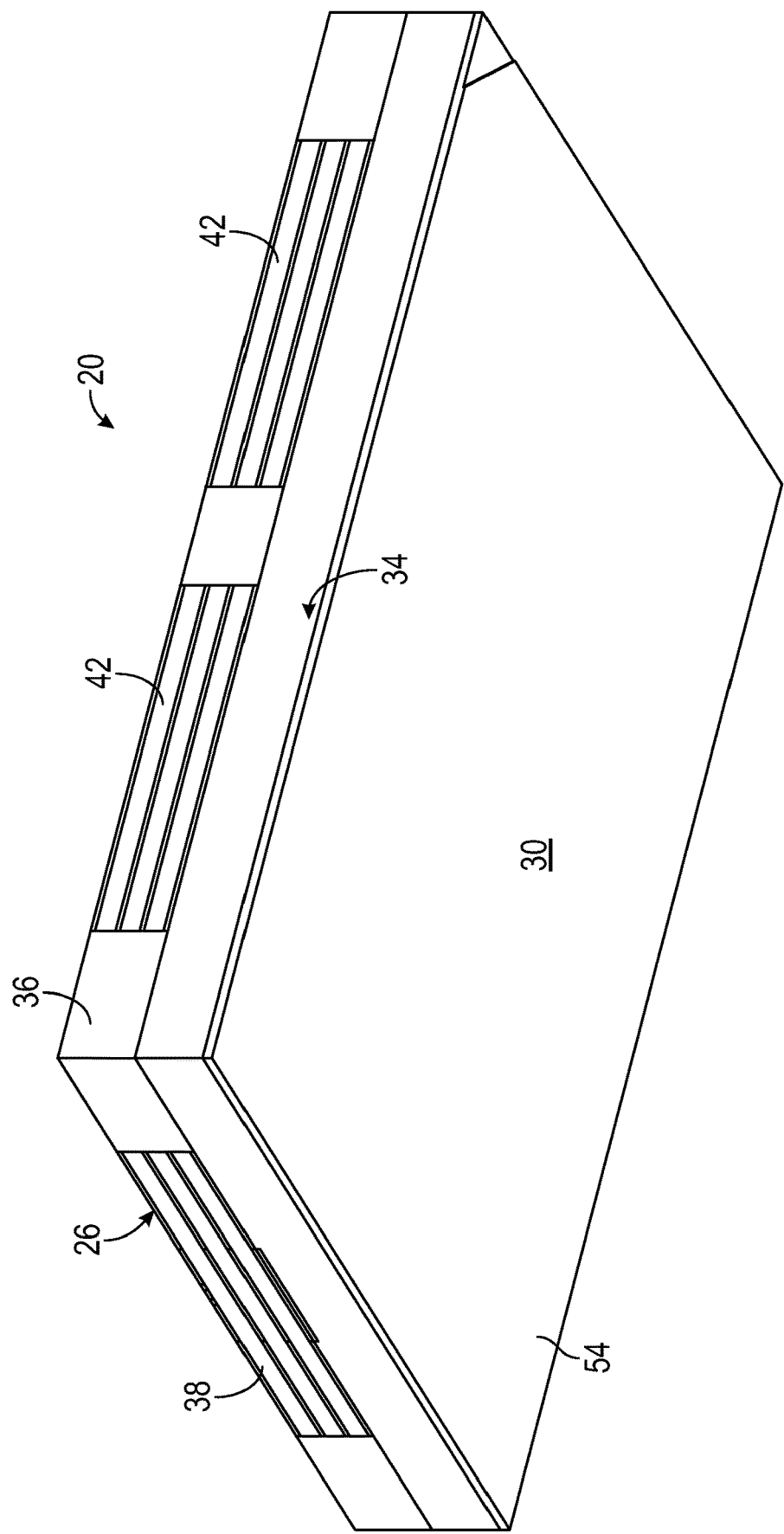

FIGS. 1 and 2 are top and bottom isometric views, respectively, of a microelectronic package 20 including a coaxially-shielded RF I/O interface 22, 24, as illustrated in accordance with an example embodiment of the present disclosure. In addition to coaxially-shielded RF I/O interface 22, 24, microelectronic package 20 also includes a package body 26 having opposing principal surfaces, referred to herein as a "package topside surface 28" and a "package bottomside surface 30." Package surfaces 28, 30 are opposed in a package thickness or height direction; that is, a direction taken along an axis orthogonal to either or both of surfaces 28, 30 (e.g., package centerline 92), and further corresponding to the Z-axis of coordinate legend 32 shown in FIG. 1. Package body 26 is defined, at least in principal part, by a package substrate 34 and an encapsulant portion 36 (also referred to as an "encapsulant body 36" herein). Encapsulant portion 36 is overmolded onto or otherwise formed over package substrate 34 to encapsulate or surround the circuit components (e.g., RF power dies) contained in package body 26. Accordingly, encapsulant body 36 may be composed of a thermoset material, an epoxy glob top, or another dielectric material or mold compound. Comparatively, package substrate 34 may assume any form suitable for supporting the packaged circuitry contained in microelectronic package 20, as well as the structural features (e.g., interposer pieces 38, 40, 42) defining coaxially-shield RF I/O interface 22, 24. In the illustrated example, specifically, package substrate 34 is realized as a multilayer PCB. The present example notwithstanding, package substrate 34 may assume a different form, whether containing or lacking electrical routing features, in other implementations.

Microelectronic package 20 contains one or more interposer pieces 38, 40, 42, which are embedded in encapsulant body 36 at various locations. In the illustrated example, specifically, six interposer pieces 38, 40, 42 are embedded in encapsulant body 36 and spaced about an outer periphery of package body 26, as viewed looking downwardly onto package topside surface 28 along centerline 92. In alternative embodiments, microelectronic package 20 may include a greater or lesser number of interposer pieces; or, perhaps, may lack any such interposer pieces altogether if, for example, the various terminals of package 20 are defined utilizing freestanding metallic (e.g., Cu) pieces or columns bonded to package substrate 34. For example, in a further implementation, the illustrated interposer pieces 38, 40, 42 may be replaced by a smaller number of larger interposer pieces, such as a single interposer piece having a ring-shaped planform geometry and extending about an outer periphery of package 20. In either instance, the interposer piece or pieces embedded within encapsulant body 36 may be bonded to, or otherwise electrically coupled to, package substrate 34 to provide the desired mechanical attachments and electrical interconnections described below. In this regard, interposer pieces 38, 40, 42 extend from corresponding internal contacts or bond pads provided within package 20 (e.g., present on die support surface 60 of package substrate 34, identified in FIGS. 3-5) to package topside surface 28. Upper patterned metal layers or pads formed on interposer pieces 38, 40, 42 define various electrically-conductive terminals 44, 46, 48, 50, 52, which are exposed from the exterior of microelectronic package 20 to yield a topside I/O interface 44, 46, 48, 50, 52 of package 20.

The package topside terminals defining topside I/O interface 44, 46, 48, 50, 52 (also referred to individually as "topside terminals 44, 46, 48, 50, 52") are accessible along, and may be substantially coplanar with, topside surface 28 of microelectronic package 20. As described more fully below, topside terminals 44, 46, 48, 50, 52 may be metallic (e.g., Cu) features formed on the uppermost surfaces or ends of interposer pieces 38, 40, 42 opposite package substrate 34, as taken along package centerline 92 (corresponding to the package height direction and the Z-axis of coordinate legend 32). Specifically, such metallic features or pads (topside terminals 44, 46, 48, 50, 52) may be exposed through the uppermost surface of encapsulant body 26 by attaching the interposer pieces 38, 40, 42 to the frontside or die support surface of package substrate 34; depositing an excessive volume of mold compound to create an overburden fully encapsulating or covering interposer pieces 38, 40, 42 (yielding encapsulant body 26); and then back-grinding or otherwise thinning encapsulant body 26 to expose package topside terminals 44, 46, 48, 50, 52 along the newly-defined package topside surface 28. Interposer pieces 38, 40, 42 contained in microelectronic package 20 are positioned such that package topside terminals 44, 46, 48, 50, 52 are arranged or spatially distributed in four rows, which extend along the outer peripheral edges of microelectronic package 20. Microelectronic package 20 thus has a quad flat no-lead (QFN) or an LGA formfactor in the illustrated example. In further embodiments, microelectronic package 20 can be fabricated to have a different no-lead form factor, such as a dual flat no-lead form factor; or another package formfactor compatible with a coaxially-shielded RF I/O interface.

Embodiments of microelectronic package 20 are beneficially, although non-essentially imparted with an HTP package architecture. As appearing herein, the term "HTP package" refers to a microelectronic package having a topside I/O interface (e.g., topside I/O interface 44, 46, 48, 50, 52 in the illustrated example) and further having a thermal interface (e.g., one or more metallic surfaces) provided along the opposite, backside surface 30 of package 20. In the illustrated example, the backside thermal interface of microelectronic package 20 is defined by a metal layer or multilayer system 54 (hereafter, "backmetal layer 54") formed over the backside surface or non-populated side of package substrate 34. In other embodiments, the backside thermal interface of package 20 may be defined by a different surface or combination of surfaces exposed along package backside surface 30, such as the exposed bottom surface of one or more metallic coins embedded in package substrate 34. Regardless, the packaged circuitry (e.g., power amplifier die or dies within package 20) may be attached to coins embedded in package substrate 34 or high metal content regions of substrate 34 (e.g., regions containing bar vias, tub vias, or via farms) utilizing a thermally- and electrically-conductive bonding material (e.g., a solder, a sintered material, or a metal particle-containing die attach material), with the coins extending to backmetal layer 54 to form a low thermal resistance path from the packaged die(s) to the package backside thermal interface. When microelectronic package 20 is installed within a larger microelectronic system, backmetal layer 54 may be placed in thermal communication with a heatsink, a metal chassis, or a similar feature included in a larger microelectronic system to promote conductive heat extraction from microelectronic package 20 in a direction substantially opposite topside I/O interface 44, 46, 48, 50, 52. In other instances, the thermal interface of microelectronic package 20 may be left exposed for convective heat dissipation to the surrounding environment when, for example, microelectronic package 20 is utilized in a low thermal performance application. In still other embodiments, microelectronic package 20 may lack such a thermal interface; or package 20 may include a thermal interface (e.g., an exposed backside surface of a metallic base flange) located on the same side of the package body as is the package I/O interface, providing package 20 includes at least one coaxially-shielded RF input, at least one coaxially-shielded RF output, or a combination thereof.

Backmetal layer 54, or a patterned portion of backmetal layer 54, may also serve as an electrically-active structure or terminal of microelectronic package 20 in embodiments. For example, backmetal layer 54 may also serve as a ground terminal of package 20 in certain instances; and, specifically, may provide electrical connection (along with coins embedded in substrate 34) to source terminals of field effect transistors (FETs) carried by the die or dies contained within package 20, as further discussed below in connection with FIG. 3. In other implementations, this may not be the case, and any ground connections of package 20 may be provided solely via the package topside I/O interface (e.g., terminals 46, 50 and possibly one or more of terminals 52). In either instance, backmetal layer 54 can be patterned to define different electrically-isolated features; or, instead, may serve as a continuous ground plane covering the entirety or substantial entirety of the package backside in various implementations of package 20. Such a unique construction enhances the electrical and thermal performance aspects of certain packages by, for example, providing a topside I/O interface spaced from the package substrate (here, package substrate 34) in a first direction (an upward direction in the orientation shown in FIG. 1), while further providing a robust, low thermal resistance heat conduction path extending through the package substrate and to the backside thermal interface in a second, opposing direction, as previously described.

Package topside I/O interface 44, 46, 48, 50, 52 can include any number and type of terminals providing electrical connection to the circuitry contained with microelectronic package 20. In the embodiment shown in FIGS. 1 and 2, package topside I/O interface 44, 46, 48, 50, 52 includes the following terminals: (i) a first topside RF signal terminal 44, (ii) a first topside ground terminal 46 adjacent and extending at least partially around RF signal terminal 44; (iii) a second topside RF signal terminal 48; (iv) a topside ground terminal 50 adjacent and extending at least partially around RF signal terminal 48; and (v) any number of additional topside terminals 52 providing various other connections to the packaged circuitry. Topside RF signal terminals 44, 48 are input and output terminals, respectively, in the illustrated example; and are thus referred to as "RF input terminal 44" and "RF output terminal 48" below. Jointly, topside RF input terminal 44 and the associated coaxial ground terminal 46 define a coaxially-shield RF input 22 of microelectronic package 20. Similarly, topside RF output terminal 48 and coaxial ground terminal 50 define a coaxially-shield RF output 24 of package 20. As indicated briefly above, the terminals or bond pads forming topside I/O interface 44, 46, 48, 50, 52 of microelectronic package 20 may be defined by patterned metal layers or bond pads formed on the uppermost surfaces of one or more interposer pieces 38, 40; the term "uppermost surface," as utilized in this context, referring to a principal surface of an interposer piece located furthest from package substrate 34 taken in a package thickness or height direction corresponding to the Z-axis of coordinate legend 32. Additional description of example realizations of coaxially-shield RF I/O interfaces 22, 24 and interposer pieces 38, 40, as well as any number additional interposer pieces 42 potentially incorporated into embodiments of microelectronic package 20, is set-forth below in connection with FIGS. 4-14.

When provided, additional topside terminals 52 may serve as signal (RF or non-RF) input terminals, as signal (RF or non-RF) output terminals, or electrical ground terminals for connection to various circuitry components within microelectronic package 20 and mounted to the populated frontside or die support surface of package substrate 34. In implementations in which microelectronic package 20 is a PA package containing one or more RF power dies utilized for RF signal amplification purposes, package 20 may further contain input or output impedance matching networks, bias circuitry, harmonic terminations, grounded shield structures, and other such circuit elements combined to form a PA circuit structure, such as a Doherty PA architecture. For example, in an alternative implementation in which package 20 is imparted with a Doherty PA architecture, while lacking a power splitter or combiner node, package topside I/O interface 44, 46, 48, 50, 52 may be fabricated to include a first coaxially-shielded RF input (to which the peaking input signal is applied), a second coaxially-shielded RF input (to which the carrier input signal is applied), a first coaxially-shielded RF output (at which the peaking signal is outputted), and a second coaxially-shielded RF input (at which the carrier signal is outputted). In other embodiments in which package 20 has a Doherty architecture, only a single coaxially-shielded RF input or RF output may be included in the topside I/O interface when package 20 contains a power divider or a combiner node, respectively. Any and all such circuit elements may be contained in embodiments of package 20, with connection provided to the circuit elements through additional topside terminals 52. Additionally, certain ones of additional topside terminals 52 may be left electrically floating in embodiments. As a further possibility, any or all of interposer pieces 42 and terminals 52 may be omitted from microelectronic package 20 in other embodiments. Such additional topside terminals 52 are therefore generally auxiliary to embodiments of the present disclosure and are described below to provide an example context in which embodiments of coaxially-shielded RF I/O interface 22, 24 may be better understood.

Figure 3:
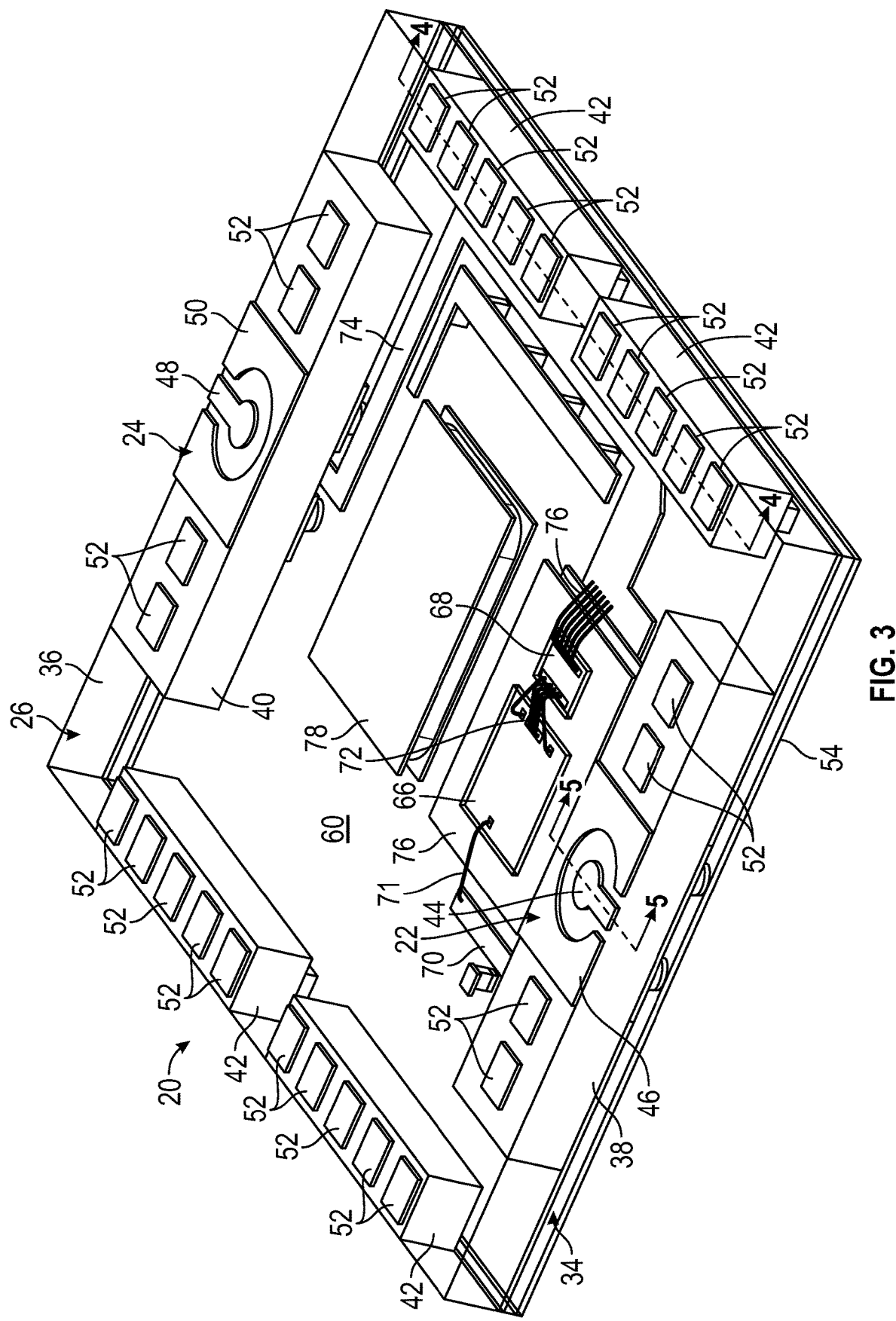
FIG. 3 is an isometric view of the microelectronic package shown in FIGS. 1 and 2 with the package substrate and encapsulant body hidden from view to more clearly illustrate example circuit components (a few of which are shown) suitably contained in embodiments of the microelectronic package.

Referring now to FIG. 3, microelectronic package 20 is shown with encapsulant body 36 hidden from view to more clearly reveal the microelectronic components or packaged circuitry contained within package 20 and mounted to die support surface 60 of package substrate 34. In this example, the illustrated packaged circuitry includes two power transistor dies 66, 68, which are mounted to package substrate 34. Specifically, power transistor dies 66, 68 may be mounted to one or more heat dissipation structures, which are embedded in package substrate 34 and which extend to backmetal layer 54 as discussed below in connection with FIG. 4. Power transistor dies 66, 68 are interconnected in a two-stage PA arrangement. Specifically, an input of power transistor die 66 (e.g., a driver-stage die) is coupled to RF input terminal 44 of microelectronic package 20 through one or more conductive structures; here, an RF input transmission line 70 and one or more wirebonds 71. Transmission line 70 may be a patterned metal (e.g., Cu) trace formed on the frontside or die support surface 60 of package substrate 34 (also partially hidden from view in FIG. 3). The output of driver-stage die 66 is coupled to an input of a final-stage die 68 via a set of wirebonds 72, and the output of final-stage die 68 coupled to an RF output transmission line 74 via another set of wirebonds 76. Transmission line 74 carries the amplified RF output signal to a non-illustrated lower pad of interposer piece 40, with the RF output signal then carried upward through interposer piece 40 and to RF output terminal 48 for connection to a corresponding bond pad provided on a system-level substrate. In further embodiments, microelectronic package 20 may include additional non-illustrated power transistor dies and other circuit components in addition to or in lieu of power transistor dies 66, 68. For example, in further implementations in which package 20 is imparted with a Doherty PA architecture, microelectronic package 20 can contain a second pair of transistor dies similar to power transistor dies 66, 68, with one set of power transistor dies functioning as a peaking signal amplifier and the other set of power transistor dies functioning as a carrier signal amplifier, as further discussed below.

In the illustrated embodiment, power transistor dies 66, 68 may each contain at least one transistor utilized for RF amplification purposes. The transistors may be implemented as FETs, such as laterally-diffused metal oxide semiconductor (LDMOS) FETs or high electron mobility transistors (HEMTs), in embodiments. Another type of transistor, such as bipolar transistors, may be employed in other instances. Further, power transistor dies 66, 68 can be implemented utilizing various different die technologies including, but not limited to silicon (Si) dies, gallium nitride (GaN) dies, gallium arsenide (GaAs dies), and silicon germanium (SiGe) dies. For example, in certain implementations, driver-stage die 66 and final-stage die 68 may be implemented utilizing the same semiconductor technology (e.g., Si or GaN dies), while this may not be the case in other instances. It is also possible for driver-stage die 66 and final-stage die 68 to be replaced by a single die in embodiments, which bears a two-stage amplifier architecture or a single stage amplifier architecture. Generally, then, any number and type of transistor-bearing dies may be incorporated into microelectronic package 20 capable of providing the desired RF signal amplification function.

Other non-illustrated circuitry components may also be contained in microelectronic package 20 in embodiments. Such components are generally inconsequential to embodiments of the present disclosure, providing that microelectronic package 20 contains at least one instance of RF input interface 22 and/or at least one instance of RF output interface 24 as previously noted. This notwithstanding, in certain instances, microelectronic package 20 may be produced to have a Doherty package architecture. In this case, power transistor dies 66, 68 may collectively form a peaking (or carrier) amplifier section, while two additional, non-illustrated power transistor dies (e.g., mounted to area or coin 78) cooperate to form a carrier (or peaking) amplifier section. Further, for proper Doherty operation, the carrier amplifier may be biased to operate in a class AB mode, and the peaking amplifier may be biased to operate in a class C mode. Other components or circuitry elements may also be contained in microelectronic package 20 in such instances, including a power splitter (if microelectronic package 20 includes a single RF input 22 as shown) to divide the RF input signal into carrier and peaking signals, various phase shift and impedance matching elements (e.g., a phase shift element to create about the requisite phase difference between the RF signals provided at the splitter output terminals), and a combiner node to recombine the amplified carrier and peaking signals (if microelectronic package 20 includes a single RF output 24 as shown). Other circuit configurations are also possible, with such circuit elements also suitably realized on the motherboard or PCB on which microelectronic package 20 is ultimately installed; e.g., in embodiments, the power splitter may be located on the motherboard with microelectronic package 20 having two instances of coaxial RF input interface 22 or, perhaps, more than two instances of input interface 22 in the case of an N-way Doherty amplifier structure having three or more amplifier paths. Similarly, if lacking a combiner node, microelectronic package 20 may possess multiple instances of coaxial RF input interface 24 for outputting the peaking and carrier signals, which are then combined outside of microelectronic package 20.

Figure 4:
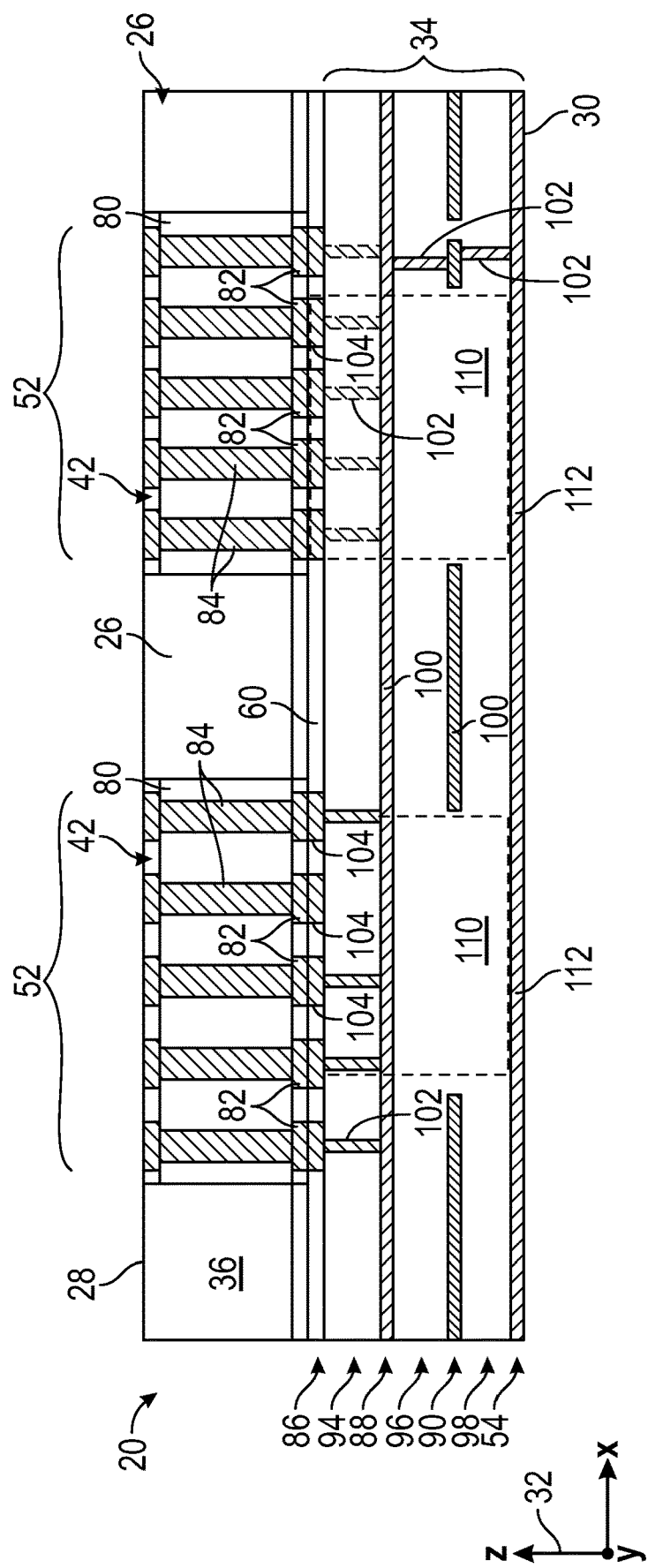
FIG. 4 is a side cross-sectional view of the example microelectronic package shown in FIGS. 1 and 2, as taken along a section plane 4-4 identified in FIG. 3 and extending through two adjacent interposer pieces.

FIG. 4 is a cross-sectional view of microelectronic package 20 taken along section plane 4-4 (identified in FIG. 3), which extends through two adjacent interposer pieces 42 defining one row of package topside terminals 52. Here, it can be seen that interposer pieces 42 each include a dielectric interposer body 80, upper metal layers patterned to define upper interposer pads or topside terminals 52, lower interposer pads 82, and electrically-conductive interposer vias 84 embedded within dielectric interposer body 80. Interposer vias 84 extend within dielectric interposer body 80 in principally a vertical or package height direction (corresponding to the Z-axis of coordinate legend 32) to electrically couple corresponding pairs of upper and lower interposer pads. The illustrated interposers pieces 42 are positioned over patterned metal features (bond pads) included in an upper patterned metal layer 86 of package substrate 34. As noted above, package substrate 34 assumes the form of a multilayer PCB having internal patterned metal layers 88, 90 interspersed with dielectric layers 94, 96, 98, which may be composed of FR-4, ceramic, or another PCB dielectric material. The bottommost metal layer of package substrate 34 (namely, backmetal layer 54) may be left as a non-patterned or continuous ground plane in the illustrated example. In other embodiments, backmetal layer 54 may be patterned to define discrete metal (e.g., Cu) traces or lines in further embodiments; or, perhaps, backmetal layer 54 may include a combination of such features. Various electrically-conductive features 100, such as metallic traces or additional ground planes, are formed in intermediate metal layers 88, 90, as generally shown in FIG. 4; while electrically-conductive vias 102 (a few of which are labeled) are formed at selected locations through dielectric layers 94, 96, 98 to provide the desired layer-to-layer electrical connectivity within substrate 34. Uppermost metal layer 86, in particular, is patterned to define a number of substrate bond pads 104 (a few of which are labeled in FIG. 4), as well as a coaxial ground pad 141 and an RF transmission line 146 (further described below in connection with FIGS. 5-8). With respect to substrate bond pads 104, in particular, electrical connections are formed between lower interposer pads 82 of interposer pieces 42 and corresponding substrate bond pads 104 utilizing, for example, an electrically-conductive bonding material, such as a solder material, an electrically-conductive die attach material, or a sintered material.

Package substrate 34 may further include one or more embedded thermal dissipation structures 110 to which the packaged die or dies (e.g., power transistor dies 66, 68 shown in FIG. 3) are bonded. When provided, such thermal dissipation structures 110 may extend between the opposing principal surfaces 30, 60 of package substrate 34. Power transistor dies 66, 68 may be physically and electrically coupled to surfaces of thermal dissipation structures 110 exposed along, and substantially coplanar with, die support surface 60 of package substrate 34. Bottom surfaces 112 of thermal dissipation structures 110 may be exposed along the opposing non-populated surface or backside of package substrate 34; or, instead, bottom surfaces 112 of thermal dissipation structures 110 may contact and be covered by backmetal layer 54, as shown. In either instance, thermal dissipation structures 110 provide a low thermal resistance pathway between the packaged dies and bottom surfaces 112 of thermal dissipation structures 110 and, therefore, backmetal layer 54 and backside 30 of package substrate 34. In various embodiments, thermal dissipation structures 110 may assume the form of thermally- and electrically-conductive metallic coins, which may be press-fit or otherwise embedded in through-holes extending between surfaces or sides of package substrate 34. In other embodiments, thermal dissipation structures 110 may each include thermally-conductive vias, such as tub vias, bar vias, or a via farm, extending between the opposing principal surfaces or sides of package substrate 34. As described in more detail below, exposed bottom surfaces 112 of thermal dissipation structures 110 (or the portion of patterned metal layer 54 underlying those surfaces 112) may be physically and thermally coupled to a heatsink when microelectronic package 20 is integrated within a larger electrical system. Finally, while package substrate 34 is shown to include three dielectric layers 94, 96, 98 and four patterned metal layers 86, 88, 90, 54 in the example of FIG. 4, other embodiments of package substrate 34 may include a different number of metal and dielectric layers.

Figure 5:
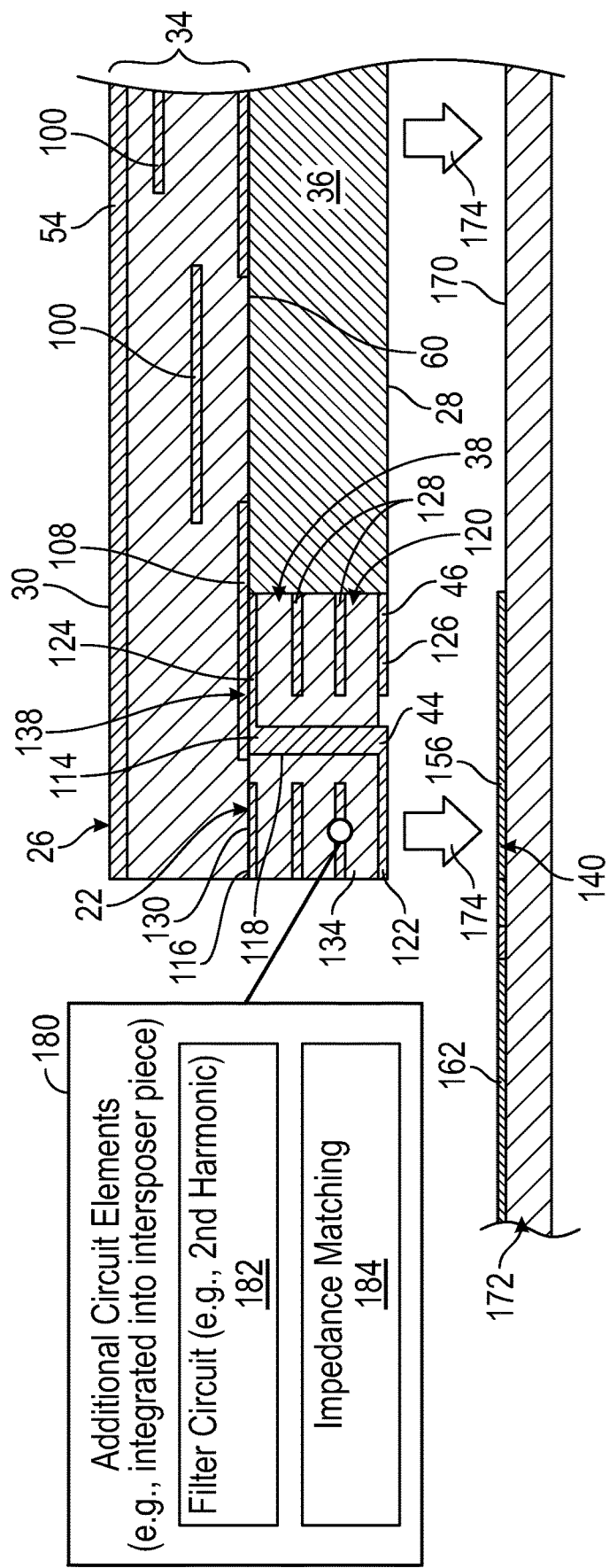
FIG. 5 is cross-sectional view of the microelectronic package shown in FIGS. 1-4, as taken along a section plane 5-5 identified in FIG. 3 extending through an additional interposer piece in which a coaxial RF input interface is formed, further illustrating one manner in which the package may be installed on a system-level substrate in an inverted orientation.

FIG. 5 is cross-sectional view of microelectronic package 20, as taken along a section plane 5-5 identified in FIG. 3 extending through interposer piece 38 in which coaxial RF input interface 22 is formed. In a manner similar to interposer pieces 42 described above in connection with FIG. 4, interposer piece 38 is implemented utilizing a multilayer PCB. The PCB includes a number of patterned metal layers 126, 128, 130 interspersed with a number of dielectric layers, which collectively form a dielectric interposer body 134. Specifically, in the illustrated example, interposer piece 38 includes four such patterned metal layers 126, 128, 130 interspersed with three dielectric layers, but may include a greater or lesser number of patterned metal and dielectric layers in further implementations. As noted above, the dielectric layers forming dielectric interposer body 134 may be produced from any suitable dielectric material, including FR-4, ceramic materials, and other materials of the type commonly utilized in PCB construction. Interposer piece 38 is fabricated to include a number of patterned interposer pads along the uppermost surface of piece 38 and defining topside terminals 44, 46, 52. Interposer piece 38 also includes a number of lower interposer pads (hidden from which view in FIG. 5). The general construction of interposer piece 38 may be substantially identical to interposer pieces 42 described above. However, in contrast to interposer pieces 42, interposer piece 38 further includes a coaxially-shielded RF input interface 22, which is formed in a central portion of interposer piece 38. Coaxially-shielded RF output interface 24 and interposer piece 40 are substantially identical in construction relative to coaxially-shielded RF input interface 22 and interposer piece 38 in the illustrated example, albeit with the orientation of interposer piece 38 rotated by 180°, as taken about the centerline of package 20 (represented by double-headed arrow 92 in FIG. 1 and corresponding to the Z-axis of coordinate legend 32). The following description of coaxially-shielded RF input interface 22 and interposer piece 38 is thus equally applicable to coaxially-shielded RF output interface 24 and interposer piece 40.

Figure 6:
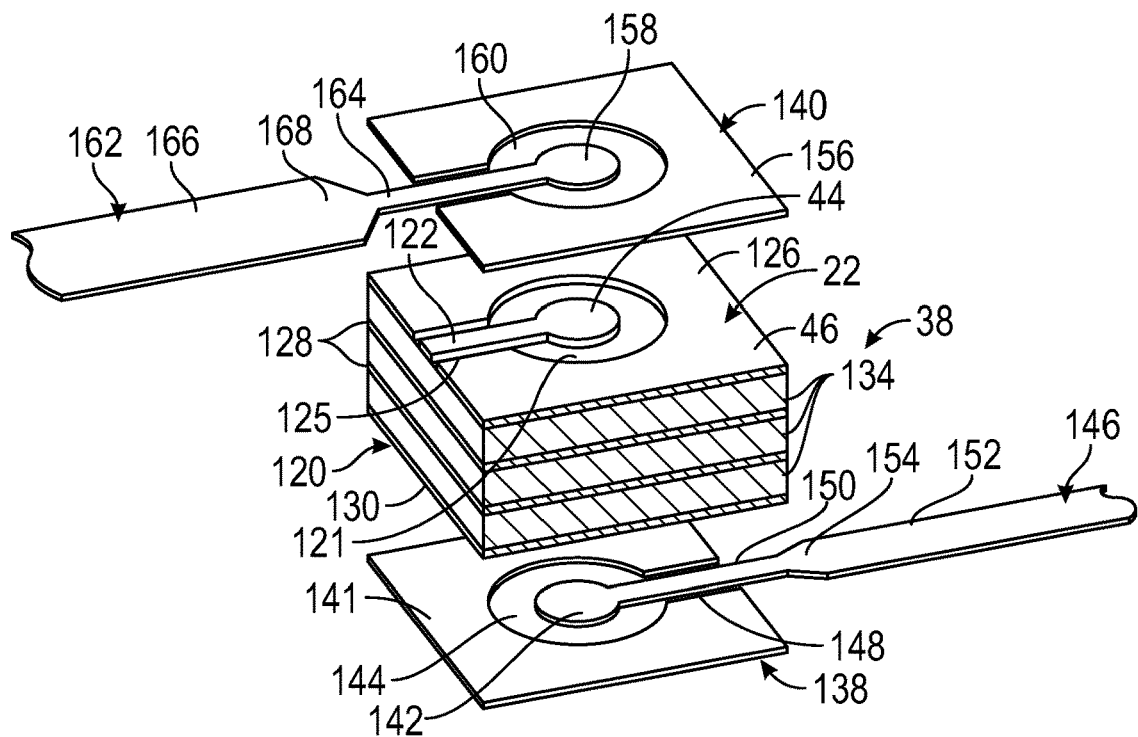
FIGS. 6 and 7 are top and bottom isometric views, respectively, of an interposer piece (partially shown) defining a coaxially-shielded RF input and corresponding electrical routing features (transmission lines, RF signal pads, and coaxial ground pads) suitably provided on the package substrate and the system-level substrate in embodiments.
Figure 7:
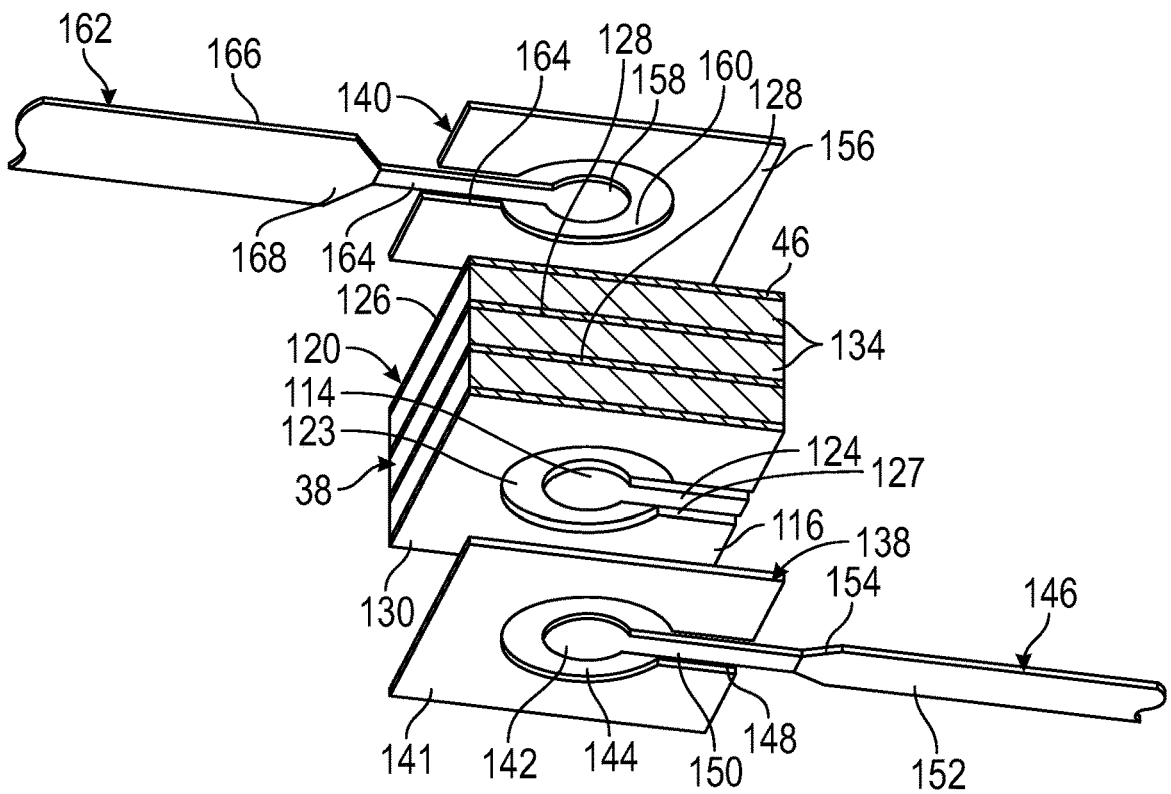
Figure 8:
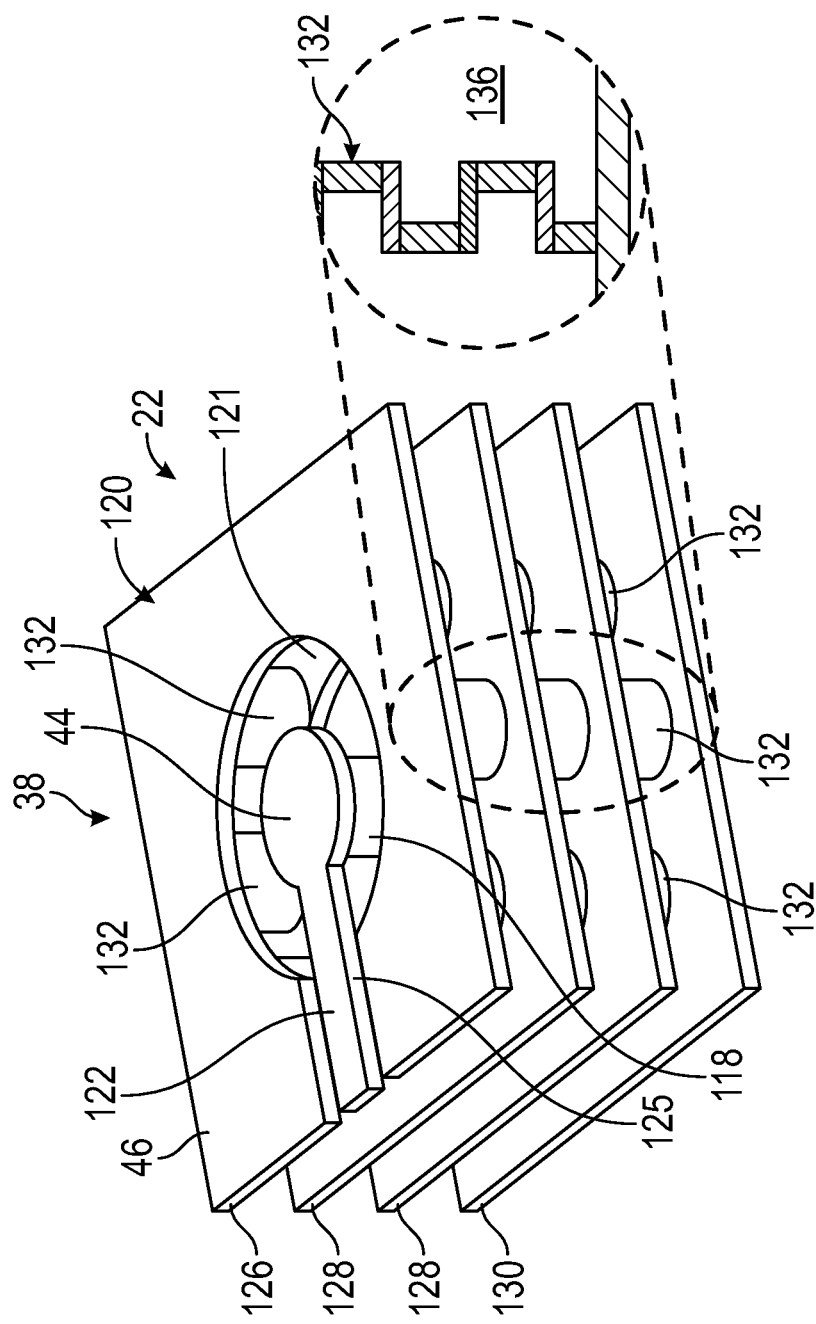
FIG. 8 is an isometric view of the interposer piece shown in FIGS. 6 and 7, with the dielectric layers hidden from view to more clearly reveal a coaxial via cage electrically interconnecting the vertically-spaced ground plane layers surrounding the RF signal-carrying via in the example embodiment.

Referring now to FIGS. 6-8 in conjunction with FIG. 5, there is shown a central portion or section of interposer piece 38 in which coaxially-shielded RF input interface 22 is formed. In addition to topside RF input terminal 44 and topside ground terminal 46, coaxially-shielded RF input interface 22 includes the following electrically-conductive structures or features: (i) a lower or substrate-facing RF input terminal 114 (FIGS. 5 and 7), (ii) at least one lower or substrate-facing ground terminal 116 (FIGS. 5 and 7) (iii) a signal-carrying via in the form of an RF input via 118 extending from topside RF input terminal 44 to lower interposer RF input terminal 114, and (iv) a coaxial shield structure 120 extending around an outer periphery of RF input via 118. An upper peripheral gap or annular clearance 121 (FIG. 6) is provided between topside RF input terminal 44 and topside ground terminal 46 to ensure electrical isolation between terminals 44, 46. Upper peripheral clearance 121 may be a central opening formed in topside ground terminal 46, which is substantially concentric with RF input terminal 44. Similarly, a lower peripheral gap or clearance 123 (FIG. 7) is provided between lower ground terminal 116 and lower interposer RF input terminal 114. In embodiments, the upper metal layer of interposer piece 38 may be patterned to define an upper RF input extension 122, which connects to and which is integrally formed with topside RF input terminal 44. When provided, RF input extension 122 may extend from topside RF input terminal 44 in a direction away from RF input via 118 and package centerline 92 (FIG. 1) to, for example, provide additional surface area for connection with a corresponding section of an RF transmission line or microstrip, such as transmission line 162 formed on frontside 170 of system-level substrate 172 to which package 20 is attached. A slot-shaped clearance 125 is further provided between upper RF input extension 122 and topside ground terminal 126 (here, formed as a coaxial ground plane) to provide additional electrical isolation between these features. The lower metal layer of interposer piece 38 may also be patterned to include a lower RF input extension 124, which is likewise integrally formed with lower interposer RF input terminal 114. RF input extension 124 extends from lower interposer RF input terminal 114 in a direction away from RF input via 118 and toward package centerline 92. Once again, a slot-shaped clearance 127 or isolation gap separates lower RF input extension 124 and ground terminal 116 to provide the desired electrical isolation between these features.

Figure 9:
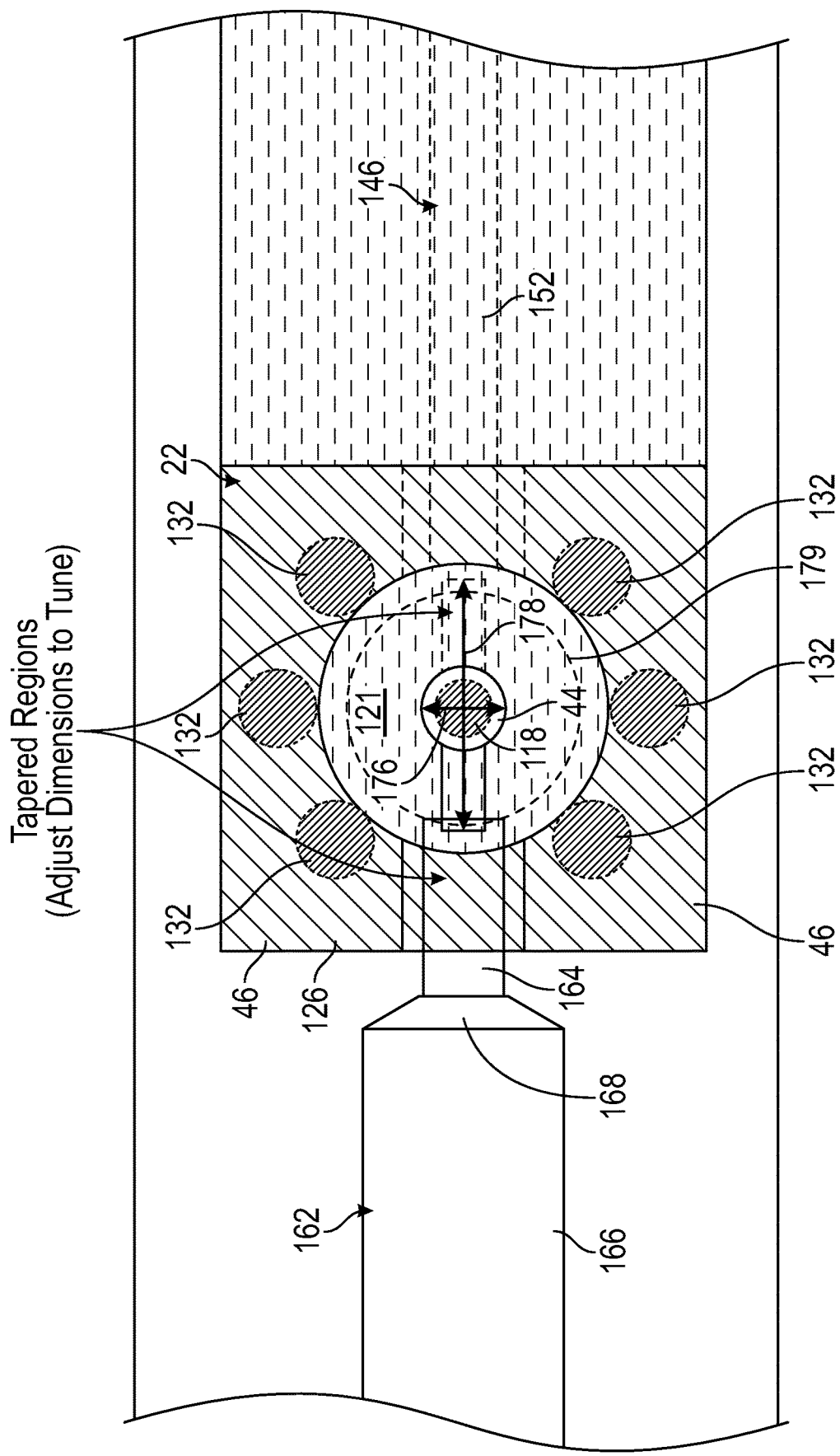
FIG. 9 is simplified top-down or planform schematic illustrating the electrically-conductive feature layout of the coaxially-shielded RF input, the package substrate, and the system-level substrate of the example embodiment shown in FIGS. 1-8.

Coaxial shield structure 120 includes a number of vertically-spaced ground plane layers 126, 128, 130; and a plurality of electrically-conductive vias 132 (shown in FIGS. 8 and 9). Ground vias 132 may extend substantially parallel to signal-carrying via 118, while being spaced therefrom by a set distance as measured from the centerline or longitudinal axis of signal-carrying via 118 to each ground via 132. Ground vias 132 extend to or through vertically-spaced ground plane layers 126, 128, 130 to electrically interconnect or tie together the ground plane layers and thus yield coaxial shield structure 120. Although having in-line through via constructions in the illustrated example, ground vias 132 may be produced to have a different construction in other instances; e.g., ground vias 132 may have a staggered, multilayer construction in further embodiments, as indicated in a detail bubble 136 appearing on the right of FIG. 8. A package substrate I/O interface 138 and a system-level substrate I/O interface 140 are formed on the respective frontsides of package substrate 34 and system-level substrate 172 (FIG. 5). Package substrate I/O interface 138 and a system-level substrate I/O interface 140 provide electrical connection to the corresponding terminals of coaxially-shielded RF input interface 22 when microelectronic package 20 is installed within a larger electronic system or assembly. With respect to package substrate I/O interface 138, in particular, this interface may include a ground plane contact 141, an RF input contact 142, a peripheral clearance or isolation gap 144 between ground plane contact 141 and RF input contact 142 (e.g., formed as an opening in coaxial shield structure), and a tapered transmission line 146. Tapered transmission line 146, in particular, extends from RF input contact 142 through a slot 148 formed in ground plane contact 141. Transmission line 146 tapers from a narrow segment 150 to a wider segment (microstrip portion) 152 at a gradually-tapered section 154.

In a manner similar to package substrate I/O interface 138, system-level substrate I/O interface 140 includes a ground plane contact pad 156, an RF input contact pad 158, a peripheral clearance or isolation gap 160 between ground plane contact pad 156 and RF input contact pad 158, and a tapered transmission line 162. Transmission line 162 extends from RF input contact pad 158 through a slot 163 (FIG. 7), which is formed in ground plane contact pad 156. Transmission line 162 tapers from a narrow segment 164 to a wider segment (microstrip portion) 166 at a transition section 168. System-level substrate I/O interface 140 may be formed on the frontside 170 of a system-level substrate 172, such a motherboard or another PCB. As indicated by arrows 174 (FIG. 5), package 20 is mounted to system-level substrate 172 in an inverted or face-down orientation such that topside I/O interface 44, 46, 48, 50, 52 of package 20 faces frontside 170 of substrate 172. Physical mounting and appropriate electrical connections are established utilizing an electrically-conductive bonding material (not shown), such as an electrically-conductive die attach material, solder, or a sintered material. As noted above, such an inverted mounting avails the thermal interface provided along backside 30 of microelectronic package 20 for thermal coupling to a non-illustrated system-level heatsink, such as a metal chassis or fin array. This enables excess heat generated by power transistor dies 66, 68 and/or other microelectronic components within package 20 to be efficiently extracted from the package interior and conducted through heat dissipation structures (e.g., metallic coins) 110, through backmetal layer 54, and ultimately to the system-level heat sink for convective transfer to the surrounding environment. In this manner, microelectronic package 20 may provide optimized thermal performance aspects, while the electrical performance aspects of package 20 may further be optimized through the incorporation of coaxially-shielded RF I/O interface 22, 24.

Coaxial shield structure 120 is sized and shaped to extend at least partially around, or to partially circumscribe, an outer periphery of RF input via 118. As shown most clearly in FIGS. 8 and 9, ground vias 132 may be arranged in a generally circular array, which is substantially concentric with RF input via 118 to form as an electrically-grounded via cage; the term "electrically-grounded via cage" or, more simply, "grounded via cage" referring to a cage-like array or grouping of vias configured to be electrically coupled to ground during microelectronic package operation. The via cage may fully surround or circumscribe RF input via 118 in the illustrated example, with increased angular spacing potentially provided between certain adjacent vias to allow the passage of extensions 122, 124. In other instances, a lesser number of vias may be arranged in an arc-shaped (e.g., semicircular) grouping, which extends at least partially around RF input via 118 to provide shielding over a more limited angular range (e.g., in a direction facing the package centerline), as discussed below in connection with FIGS. 10-13. In various embodiments, ground vias 132 may be arranged in a circular or semi-circular array that is substantially concentric with the signal-carrying via (here, RF input via 118) such that ground vias 132 are each spaced from the signal-carrying via by a substantially equivalent distance, while this may not be the case in other instances; e.g., in further embodiments, ground vias 132 may be arranged in a different spatial distribution, such as a grid distribution or in a single row, that may or may not be concentric with the single carrying via. It is also possible, in embodiments, for a single ground via to intersect, and thus equally couple, ground plane layers 126, 128, 130 formed in the patterned metal layers of interposer piece 38.

In the illustrated embodiment, vertically-spaced ground plane layers 128, 130 are each patterned to include a central opening, which is similar or identical to central opening or clearance 121 of uppermost coaxial ground plane 126. Such central openings provided the requisite electrical isolation between the signal-carrying via (here, RF input via 118) and the surrounding coaxial shield structure 120. Additionally, the coaxial ground planes 128 formed in the intermediate patterned metal layers of the interposer piece may extend fully around RF input via 118 in a continuous or unbroken manner to provide 360° EMI shielding about RF input via 118 at transitions between the topside I/O interface and the underlying package substrate. Comparatively, upper and lower coaxial ground planes 126, 130 extend over an angular range greater than 300°, as taken about the longitudinal axis or centerline of RF input via 118, broken only by isolation slots 125, 127 shown in FIGS. 6-8. So too is the electrically-grounded via cage formed by ground vias 132 angularly distributed or peripherally spaced about RF input via 118 at selected angular internals to further provide comprehensive EMI coverage or shielding surrounding RF input via 118 along the entirety or substantial entirety of the via length, while accommodating the passage of terminal extensions 122, 124 projecting from RF terminals or interposer pads 44, 114 further included in coaxially-shielded RF input interface 22.

By virtue of the above-described structural configuration, coaxial shield structure 120 emulates the outer shielding of a coaxial cable to reduce the susceptibility of RF input via 118 to EMI and optimize the electrical performance of microelectronic package 20. In particular, at the vertical transitions between topside RF input terminal 44 and package substrate 34, coaxial shield structure 120 extends around the signal-carrying via (here, RF input via 118) to provide shielding over a substantially complete, 360° angular range, as taken about the via centerline or longitudinal axis. Given that ground plane layers 126, 128, 130 are vertically spaced or distributed across the majority, if not the substantial entirety of the height of interposer piece 38, and further that interposer vias 118, 132 have substantially equivalent lengths, such shielding extends along the entirety or substantial entirety of the length of RF input via 118. Due to the inclusion of contact extensions 122 and 124 within coaxially-shielded RF input interface 22 (which vertically-overlap with narrow sections 150, 164 of transmission lines 146, 162, respectively), a relatively large surface area is provided to establish electrical contact with the corresponding electrical contacts of package substrate I/O interface 138 and a system-level substrate I/O interface 140, while further ensuring electrical isolation between ground plane layers 126, 130 and transmission lines 146, 162. A similar or identical coaxial shield structure is likewise formed about a signal-carrying via (an RF output via) connecting to RF output terminal 48 included in coaxially-shielded RF output interface 24 and interposer piece 40. Such improved EMI shielding may consequently suppress unwanted RF leakage or coupling effects, evanescent modes, higher order modes, parallel plate (stripline) modes, and otherwise improve overall performance of package 20. As an additional advantage, coaxial shield structure 120 can be dimensionally adjusted to optimize such shielding characteristics, as well as to provide finely-tuned impedance matching with transmission lines 146, 162 formed on package substrate 34 and system-level substrate 172, respectively. For example, the planform shape, dimensions, number, and respective locations of ground plane layers 126, 128, 130 and ground vias 132 can be varied, by design, to optimize the electrical characteristics of the coaxially-shielded RF I/O interface (here, coaxially-shielded RF input interface 22), as further discussed below.

Referring now to FIG. 9 in conjunction with FIGS. 5-8, an approach similar to that utilized in designing fully-shielded coaxial RF I/O interfaces may be employed in arriving at optimized dimensions for coaxial shield structure 120 and RF I/O interface 22, 24. In this regard, in at least some embodiments, an ideal design equation for a coaxial transmission line may be utilized in designing coaxial shield structure 120, given that the target characteristic impedance $Z0$ and dielectric constant of the dielectric interposer material are known parameters. For example, in one design approach, the following equation (EQ. 1) may be utilized to calculate the inner diameter of the coaxial openings formed in the ground plane layers of coaxial shield structure 120, as identified in FIG. 9 by double-headed arrow 178 (hereafter, "D_coaxial_gap") based upon the outer diameter of signal-carrying RF via 118, as identified by double-headed arrow 176 (hereafter, "D_via"). In EQ. 1 below, L and C respectively denote the unit inductance and capacitance of the coaxially-shielded RF I/O interface, $\mu_r$ denotes the relative permeability of dielectric interposer material, and $\varepsilon_r$ denotes the permittivity of dielectric interposer material:

$$Z_0 = \sqrt{\frac{L}{C}} = \frac{138}{\sqrt{\mu_r \varepsilon_r}} \cdot \log\left(\frac{(D_{coaxial\_gap})}{(D_{via})}\right)$$

In designing coaxial shield structure 120, the outer diameter (D_via) of the signal-carrying via (arrow 176, FIG. 9) may initially be selected to have a predetermined value, which may range from about 240 and to about 300 microns (μm) in embodiments; while D_via may be greater than or less than the aforementioned range in other instances. Given the other known parameters, D_coaxial_gap can then be calculated using EQ. 1 above. For example, in an embodiment in which D_via is 300 μm and in which the illustrated structure includes a 50 ohm (Ω) coaxial conductor, D_coaxial_gap may be 1380 μm. Such dimensions may be utilized to initially design coaxial shield structure 120, with additional tuning potentially performed afterwards by, for example, gradually varying one or more dimensions of coaxial shield structure 120 defined in the uppermost patterned metal layer 126 and/or the lowermost patterned metal layer 130. As indicated in FIG. 9, such additional fine tuning may be accomplished by gradually adjusting the widths of one or more of tapered transmission line sections 150, 154, 164, 168 until targeted parameters (e.g., input and output return loss performance parameters) are optimized. The tapered section of package substrate transmission line 146 (which increases in width when moving from the substrate bond pad toward the RF circuitry) thus imparts the transmission line with a predetermined operational impedance, as does the tapered section of the system-level substrate transmission line 162. In this manner, embodiments of coaxially-shielded RF I/O interface 22, 24 support precise impedance matching through the fine tuning of transmission line widths at transitions between package substrate 34, the coaxially-shielded RF I/O interface (e.g., coaxially-shielded RF input 22 and coaxially-shielded RF output 24), and the system-level substrate on which microelectronic package 20 is installed.

As previously indicated, the electrically-conductive features of coaxial shield structure 120 can be shaped, positioned, and dimensionally adjusted to enhance the electrical characteristics of coaxially-shielded RF input interface 22, such as the EMI shielding provided by coaxial shield structure 120 during usage of microelectronic package 20. With continued reference to coaxially-shielded RF input interface 22 shown in FIGS. 5-9, and again noting that the following statements are equally applicable to the coaxial shield structure contained in RF output interface 24 of microelectronic package 20, further embodiments of coaxial shield structure 120 may be fabricated such that the respective dimensions and/or geometries of the central openings provided through ground plane layers 126, 128, and 130 differ relative to the illustrated embodiment and, perhaps, differ relative to one another within a single embodiment. For example, in this regard, the central opening or openings formed through one, all, or a subset of ground plane layers 126, 128, 130 may be imparted with a non-circular planform geometry, such an ovular or polygonal (e.g., square or rectangular) planform geometry, in alternative embodiments of RF input interface 22. In other instances, the central openings formed through ground plane layers 126, 128, 130 may have similar or substantially identical planform shapes, but may vary in dimensions or size; e.g., when the openings or clearances formed in the ground plane layers have circular planform shapes, the openings formed in certain ground plane layers may be smaller than the openings formed in other ground plane layers. This latter possibility is indicated in FIG. 9 by a dashed circle 179, which denotes one manner in which one or more of ground plane layers 126, 128, 130 may be patterned to define a smaller diameter opening through which RF input via 118 extends, while other ground plane layers 126, 128, 130 are patterned to have large diameter openings through which via 118 extends to, for example, optimize the electrical performance characteristics of RF input interface 22.

It should thus be appreciated that, in embodiments of the coaxially-shielded RF interface, a first opening or clearance may be formed in a first ground plane layer of a coaxial shield structure, such as coaxial shield structure 120 of coaxially-shielded RF input 22, The first opening formed in the ground player is imparted with a desired planform shape and predetermined dimensions, such as a circular shape having a predetermined diameter. Similarly, one or more openings may be formed in a second ground plane layer (or a second set of ground plane layers) of the coaxial shield structure; with the opening or openings formed in the second ground plain layer(s) varying relative to the first opening in planform shape, in planform dimensions, or both in planform shape and dimensions. Generally, then, embodiments of the coaxially shielded RF I/O interface provide designers with a high degree of flexibility to optimize or fine-tune electrical performance characteristics at the RF interface-microstrip transitions through variations in the number and spacing of the ground plane layers (when present); through variations in the shape and dimensions of the clearances or openings provided in the ground plane layers, including by producing a single coaxial shield structure to have multiple ground plane openings differing in planform dimensions and/or shape; or through variations in the size, number, and spatial distribution of the ground vias contained within the coaxial shield structure.

When coaxially-shielded RF I/O interface 22, 24 is implemented utilizing one or more interposer pieces 38, 40, a given interposer piece may be leveraged to provide additional connections to other terminals 52 contained in topside I/O interface 44, 46, 48, 50, 52 of package 20, such as terminals providing connection to bias circuitry, to harmonic terminations, or to DC circuitry contained in package 20. So too may circuit elements be partially formed in one or both of interposer pieces 38, 40 in embodiments to perform or support other circuit functions. Such other functions can include baseband decoupling, harmonic termination, transistor (e.g., FET gate) biasing, and other signal filtering functions. For example, as indicated in FIG. 5, filter circuitry or terminations 182 (e.g., circuitry tuned to shunt energy to ground at a particular harmonic) may be integrated into interposer piece 38 (and/or interposer pieces 40) in embodiments. More specifically, in such embodiments, an input-side harmonic termination circuit may be integrated into interposer piece 38 and include, for example, a resonant inductor/capacitor (LC) circuit, with an inductive element electrically coupled to ground (or another reference voltage) through a capacitive element (thus providing a shunt capacitance). By varying the respective inductance and capacitance values of the inductive element and the capacitive element, the input harmonic termination circuit can be tuned to resonate at a targeted harmonic frequency (e.g., 2fo) in order to terminate the signal energy at the targeted harmonic frequency. In further implementations, such filter or harmonic termination circuitry 182 within interposer piece 38 may have a different construction for removing or minimizing signal energy at a targeted harmonic frequency, typically the second order harmonic frequency (2fo) of the carrier and peaking signals. Similarly, an input-side or an output-side impedance matching network 184 can be integrated into interposer pieces 38, 40 in embodiments; e.g., having a T-match configuration including inductive elements (e.g., bond wires or integrated spiral inductors) and a shunt capacitive element, such as a grounded capacitor structure, as known in other circuit contexts. Additionally or alternatively, such additional circuitry 180 may be configured for another purpose or may be omitted from interposer pieces 38, 40 altogether.

Additional Example Topside Input/Output Interfaces Suitably Included in Microelectronic Packages The foregoing has thus disclosed an example embodiment of a microelectronic package including a coaxially-shielded RF I/O interface. In the above-described example, the coaxially-shielded RF I/O interface includes both a coaxially-shielded RF input and a coaxially-shielded RF output, each including a coaxial shield structure extending at least partially around the outer periphery of a signal-carrying via. The above-described coaxially-shielded RF I/O interface may be considered fully shielded given that each coaxial shield structure provides essentially uninterrupted, 360° EMI shielding along the length of a given signal-carrying via. Such comprehensive coverage is provided due, at least in part, to the inclusion of ground plane layers, which fully surround or circumscribe the signal-carrying via as the via extends vertically through the ground plane layers. Additionally, in the previously-described example, multiple ground vias are positioned around a given signal-carrying (RF input or RF output) via to establish a circular or tubular via cage surrounding the signal-carrying via. In further embodiments, the coaxial shield structure may not provide full 360° EMI coverage about a given signal-carrying via, may lack ground vias, or may lack vertically-spaced ground plane layers, providing that the shield structure extends at least partially around the signal-carrying via for a minimum angular range (e.g., equal to or exceeding 90°, as taken about the via centerline or vertical axis) and has a generally coaxial or concentric relationship with the via to provide the desired shielding. For example, in certain embodiments, the coaxially-shielded RF I/O interface may be imparted with a so-called "half-shielded coaxial" configuration, as described below in connection with FIGS. 10 and 11; and/or the coaxially shielded RF interface may lack vertically-spaced ground plane layers (or include a single vertically-spaced ground plane layer), while including a via cage, as described below in connection with FIGS. 12 and 13. In still other embodiments, the coaxial shield structure of a given coaxial RF I/O interface will contain at least three ground vias angularly positioned or distributed about the outer periphery of a signal-carrying via to provide a cumulative shielding angle exceeding 90° and often approaching or exceeding 180°.

Figure 10:
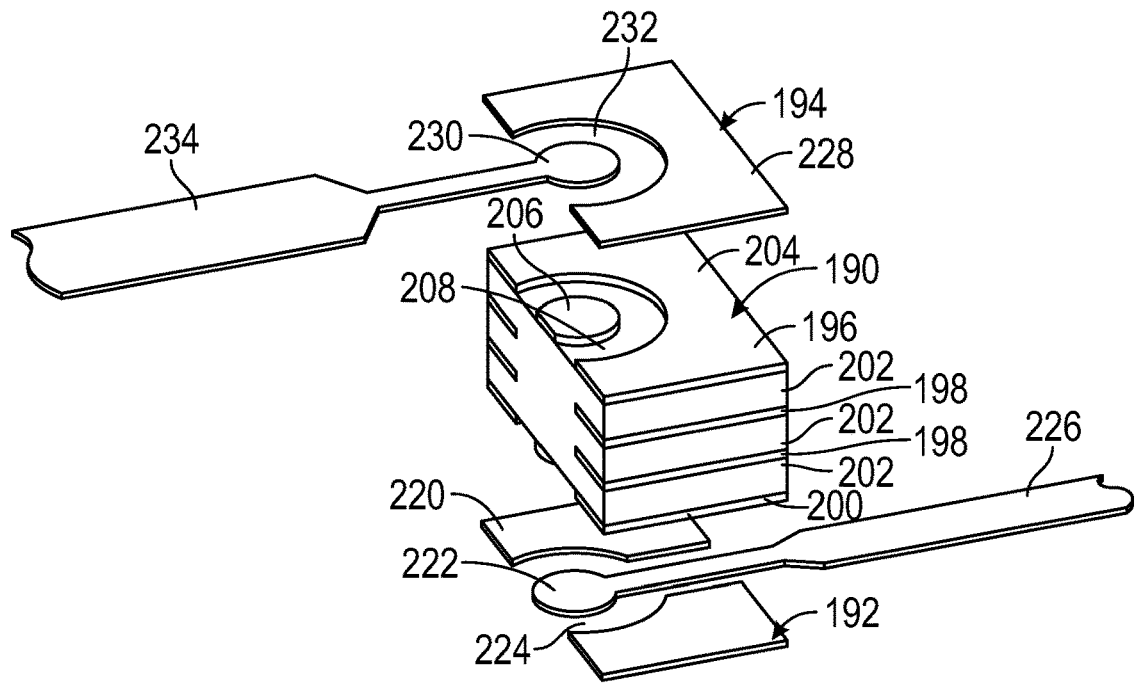
FIGS. 10 and 11 are top and bottom exploded isometric views of a coaxially-shielded RF I/O interface (dielectric layers hidden from view in FIG. 11), corresponding routing features of a package substrate (right side), and corresponding routing features of a system-level substrate (left side) in a further example embodiment in which the via cage and the vertically-spaced ground plane layers extend around a lesser fraction of the outer periphery of the RF signal-carrying via.
Figure 11:
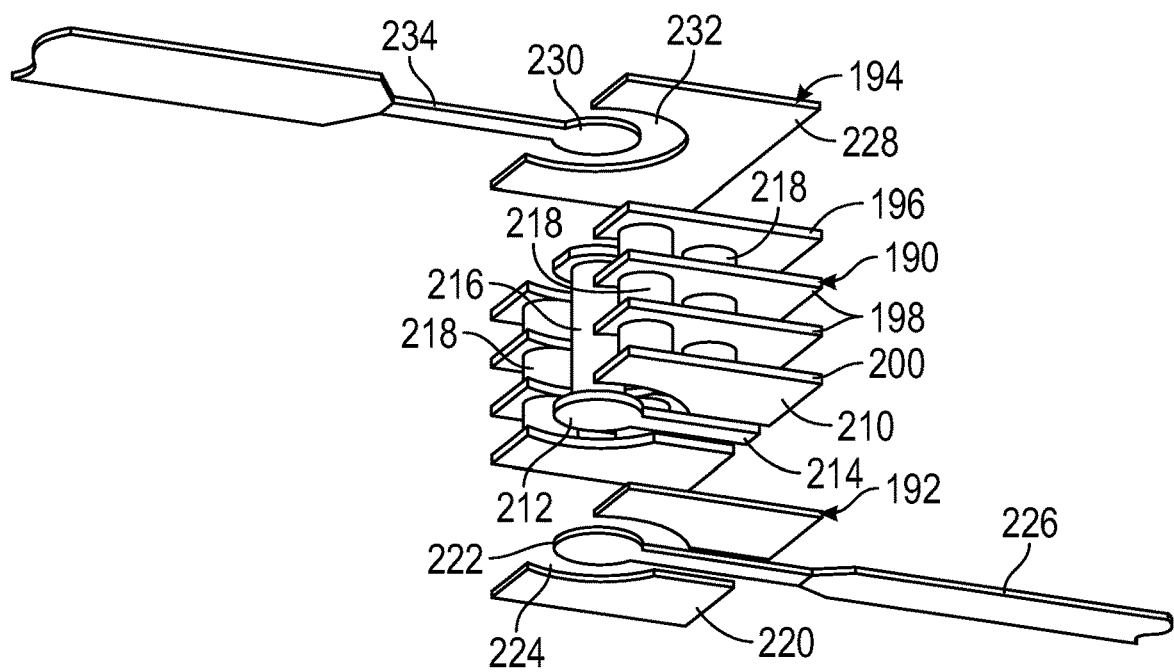

FIGS. 10 and 11 are top and bottom exploded isometric views of a coaxially-shielded RF I/O interface 190, as depicted in accordance with a further example embodiment of the present disclosure. These figures also depict a corresponding package substrate I/O interface 192 and a system-level substrate I/O interface 194, which are analogous to package substrate I/O interface 138 and system-level substrate I/O interface 140, respectively, described above in connection with FIGS. 6-9. As can be seen, coaxially-shielded RF I/O interface 190 is again formed in an interposer piece having an upper patterned metal layer 196, two intermediate patterned metal layers 198, and a lower patterned metal layer 200. Metal layers 196, 198, 200 are each patterned to include ground plane features, which are separated by a number of intervening dielectric layers 202. As shown most clearly in FIG. 10, upper patterned metal layer 196 is patterned to include a topside ground pad 204, a topside RF input terminal 206, and a peripheral clearance 208 separating topside ground pad 204 and topside RF input terminal 206. Similarly, as shown in FIG. 11, lower patterned metal layer 200 is patterned to include a lower interposer ground pad 210, a lower interposer RF input terminal 212, a peripheral clearance or central opening (not labeled) separating lower interposer ground pad 210 and lower interposer RF input terminal 212, and a lower interposer RF input terminal extension 214. A signal-carrying via 216, and specifically an RF input via 216, connects topside RF input terminal 206 and lower interposer RF input terminal 212. Multiple ground vias 218 are further provided, which may extend substantially parallel signal-carrying via 216. Additionally, ground vias 218 extend between and intersect coaxial ground planes defined in vertically-spaced metal layers 196, 198, 200, as best seen in FIG. 11, to yield a coaxial shield structure.

In the above-described manner, the ground plane features formed in vertically-spaced metal layers 196, 198, 200 and ground vias 218 cooperate to form a coaxial shield structure, which extends around the periphery of RF input via 216. Corresponding bond pad features are formed in package substrate I/O interface 192 and a system-level substrate I/O interface 194 to provide the desired electrical interconnections with coaxial RF I/O interface 190. Specifically, in the case of package substrate I/O interface 192, a coaxial ground plane 220 is provided for bonding to lower interposer ground pad 210 of coaxially-shielded RF I/O interface 190, a substrate RF bond pad 222 is provided for bonding to lower interposer RF input terminal 212, a circumferential clearance 224 is provided between ground pad 220 and substrate RF bond pad 222, and a tapered transmission line 226 extends from substrate RF bond pad 222 through a slot-shaped opening in ground pad 220 for connection to circuitry within a microelectronic package into which coaxially-shielded RF I/O interface 190 is incorporated. Similarly, a coaxial ground plane 228 is provided for bonding to topside ground pad 204, an RF pad 230 is provided for connection to topside RF input terminal 206, and a circumferential or peripheral clearance 232 is provided between ground plane 228 and RF pad 230. A transmission line or microstrip 234 extends from RF pad 230 in a direction away from interposer coaxial RF I/O interface 190. In this embodiment, coaxial RF I/O interface 190 is imparted with a half-shielded or partially shielded construction, which provides shielding in a limited direction (toward the package centerline) or over a tighter (increasingly focused) angular range. This may allow coaxial RF I/O interface 190 to possess a smaller footprint, while still providing effective EMI shielding with respect to the interior or center of the microelectronic package into which coaxially-shielded RF I/O interface 190 is integrated. Thus, when two such structure are combined (a coaxial RF input and a coaxial RF output) in a manner analogous to that shown in FIG. 1, EMI shielding is provided toward the package interior or center to, for example, reduce or eliminate input-output coupling.

Figure 12:
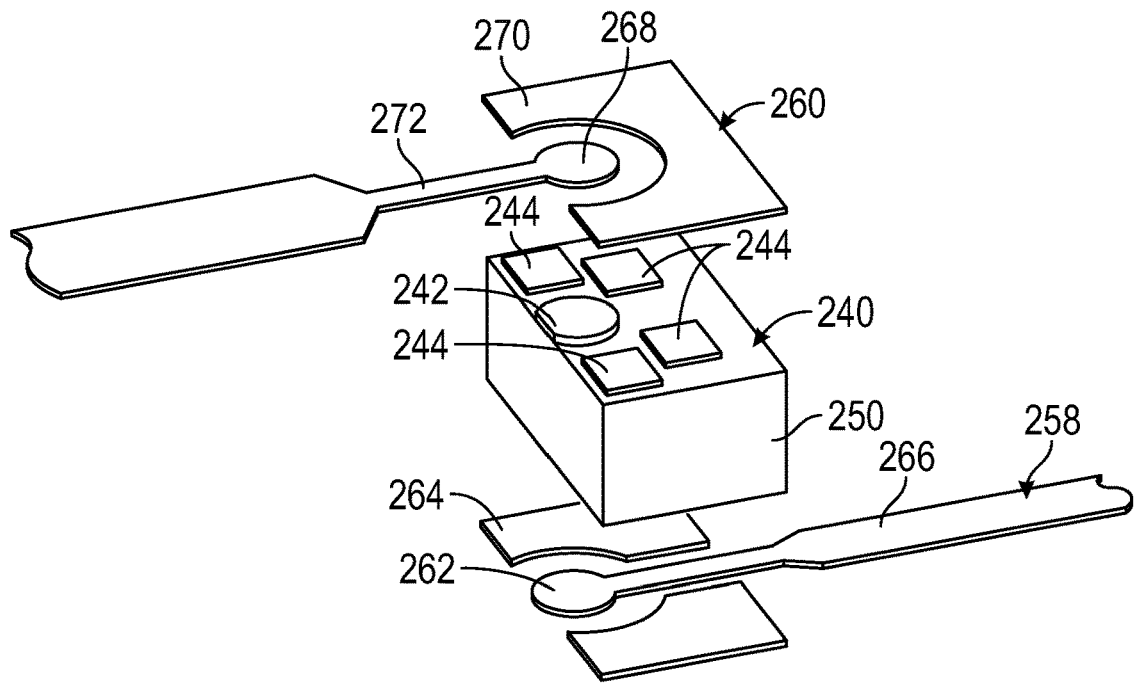
FIGS. 12 and 13 are top and bottom exploded isometric views of a coaxially-shielded RF I/O interface (dielectric layers hidden from view in FIG. 13), corresponding routing features of a package substrate (right side), and corresponding routing features of a system-level substrate (left side) in a still further example embodiment in which the RF I/O interface contains a via cage, while lacking vertically-spaced ground plane layers.
Figure 13:
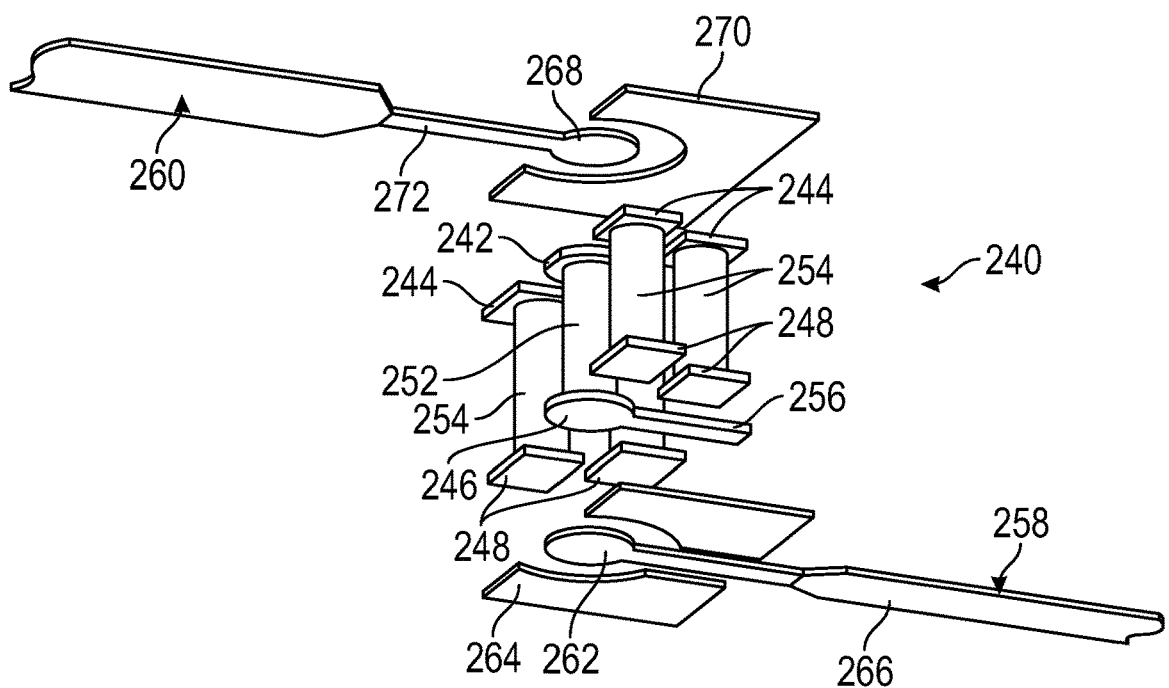

Referring lastly to FIGS. 12 and 13, a coaxially-shielded RF I/O interface 240 is depicted in accordance with a further example embodiment of the present disclosure. As was previously the case, coaxially-shielded RF I/O interface 240 may serve as either an input or output interface and includes, among other features, upper interposer pads 242, 244; lower interposer pads 246, 248; and a dielectric interposer body 250 (FIG. 12) on which interposer pads 242, 244, 246, 248 are formed. Specifically, upper interposer pads 242, 244 are formed on an uppermost surface of dielectric interposer body 250, while lower interposer pads 246, 248 are formed on an opposing, bottomside surface of interposer body 250. As further shown in FIG. 13 in which dielectric interposer body 250 is hidden from view, a number of interposer vias 252, 254 further extend within interposer body 250 to electrically couple corresponding pairs of interposer pads. Via 252 is a signal-carrying (RF input or output) via, while vias 254 are ground vias extending substantially parallel to signal-carrying via 252. Collectively, ground vias 254 form a via cage, which extends partially around and is substantially concentric or coaxial with signal-carrying via 252. Such vias 254, in combination with upper ground interposer pads 244 and lower ground interposer pads 248, thus form a coaxial shield structure providing EMI shielding in the manner described throughout this document. When installed within a package, lower interposer pads 248 may be bonded and electrically coupled to a package substrate ground pad 264 included in a package substrate I/O interface 258, while lower RF signal (input or output) pad 246 is bonded to package RF signal pad 262 from which a signal transmission line 266 extends. Once again, a terminal extension 256 may also be included in coaxially-shielded RF I/O interface 240 and overly a section of transmission line 266. Finally, as previously described, the package into which coaxially-shielded RF I/O interface 240 may be inverted and mounted to a system-level substrate on which a system-level substrate I/O interface 260 is formed. System-level substrate I/O interface 260 may include aground pad 270, an RF signal contact 268, a transmission line 272, which provide the electrical connections and functionality previously described.

CONCLUSION

Microelectronic packages including coaxially-shielded I/O RF interfaces have been provided. The coaxially-shielded I/O RF interface may include both coaxially shield RF input and output interfaces in embodiments, which may be realized utilizing one or more interposer pieces embedded in a molded package body. A given coaxially-shielded RF interposer piece includes a signal-carrying via extending principally in a package height direction and at least one coaxial shield structure. The coaxial shield structure extends substantially parallel to the signal-carrying via, while further extending around an outer periphery of the signal-carrying via. Depending upon implementation, the coaxial shield structure can include a via cage, ground plane layers, or a combination thereof to shield the signal-carrying via from EMI over an angular range greater than 90° and approaching or exceeding 180°, as taken about the longitudinal axis of the signal-carrying (RF input or RF output) via. In so doing, the coaxial shield structure, and more broadly the coaxially-shielded I/O RF interface, decrease the susceptibility of the microelectronic package to EMI potentially arising from undesired coupling of EMI emission sources, such as transmission lines carrying different RF signals. Embodiments of the coaxially-shielded I/O interface also provide other benefits including, but not limited to, facilitation of precise impedance matching at transitions between the package substrate, the coaxially-shielded RF I/O interface, and the system-level substrate on which the microelectronic package is installed.

Embodiments of a microelectronic package include a package body, RF circuitry contained in the package body, and a coaxially-shielded RF I/O interface. The package body has a package topside surface and a package bottomside surface, which are opposed in a package height direction. The coaxially-shielded RF I/O interface includes, in turn, a first topside RF signal terminal accessible from the package topside surface, a first topside ground terminal accessible from the package topside surface, and a first signal-carrying via embedded within the package body and extending principally in the package height direction. The RF circuitry is electrically coupled to the first RF signal terminal through the first signal-carrying via. The coaxially-shielded RF I/O interface further includes a first coaxial shield structure, which is electrically coupled to the first ground terminal and which extends at least partially around an outer periphery of the first signal-carrying via. Further, in certain implementations, the first topside RF signal terminal and the first signal-carrying via assume the form of a topside RF input terminal and an RF input via, respectively. In such implementations, the coaxially-shielded RF I/O interface further may further include: (i) a topside RF output terminal accessible from the package topside surface; (ii) a second topside ground terminal accessible from the package topside surface; (iii) an RF output via embedded within the package body to electrically couple the RF circuitry to the topside RF output terminal; and (iv) a second coaxial shield structure electrically coupled to the second ground terminal and extending at least partially around an outer periphery of the RF output via. Additionally, the RF input via may extend within a first interposer piece further embedded in the package body. In still other instances, the first coaxial shield structure may include a first and second ground plane layers spaced in the package height direction, as well as a first ground via electrically coupling the first and second ground plane layers. In such embodiments, the first ground plane layer may have a first opening through which the first signal-carrying via extends; the second ground plane layer may have a second opening through which the first signal-carrying via extends; and the first opening and the second opening may vary in planform shape, in planform dimensions, or both in planform shape and planform dimensions to, for example, enhance the electrical performance characteristics of the RF I/O interface.

In other implementations, the microelectronic package may include a package body having a package topside surface and a package bottomside surface. The package bottomside surface is located opposite the package topside surface, as taken along in a package height direction. Accessible from the package topside surface, a topside I/O interface includes a topside RF input terminal and a topside RF output terminal. An RF power die, such as a PA die, is contained in the package body. The RF power die has a die input terminal and a die output terminal. A signal input via electrically couples the die input terminal to the topside RF input terminal, while a signal output via electrically couples the die output terminal to the topside RF output terminal. The First and second grounded coaxial shield arrangements further extend at least partially around an outer periphery of the signal input via and at least partially around an outer periphery of the signal output via, respectively, to inhibit EMI with RF signals carried by the signal input via and by the signal output via during operation of the microelectronic package.

While at least one example embodiment has been presented in the foregoing Detailed Description, it should be appreciated that a vast number of variations exist It should also be appreciated that the example embodiment or example embodiments are only examples, and are not intended to limit the scope, applicability, or configuration of the invention in any way. Rather, the foregoing Detailed Description will provide those skilled in the art with a convenient road map for implementing an example embodiment of the invention, it being understood that various changes may be made in the function and arrangement of elements described in an example embodiment without departing from the scope of the invention as set forth in the appended claims. Numerical identifiers, such as "first," "second," "third," and the like have been used above in accordance with the order in which certain elements were introduced during the course of the foregoing Detailed Description. Such numerical identifiers may also be used in the subsequent Claims to indicate order of introduction in the Claims. Accordingly, such numerical identifiers may vary between the Detailed Description and the subsequent Claims to reflect differences in the order of introduction of elements.

What is claimed is:

1. A microelectronic package, comprising:
   a package body having a package topside surface and a package bottomside surface opposite the package topside surface, as taken along in a package height direction;
   radio frequency (RF) circuitry contained in the package body below the package topside surface; and
   a coaxially-shielded RF input/output (I/O) interface, comprising:
   a first topside RF signal terminal accessible from the package topside surface external to the microelectronic package;
   a first topside ground terminal accessible from the package topside surface external to the microelectronic package;
   a first signal-carrying via embedded within the package body and extending principally in the package height direction, the RF circuitry electrically coupled to the first topside RF signal terminal through the first signal-carrying via; and
   a first coaxial shield structure electrically coupled to the first topside ground terminal and extending at least partially around an outer periphery of the first signal-carrying via, wherein the first coaxial shield structure includes a first ground plane layer formed adjacent the topside RF signal terminal, a second ground plane layer formed below the first ground plane layer, and a third ground plane layer formed below the first ground plane layer and between the first and second ground plane layers.

2. The microelectronic package of claim 1, wherein the first topside RF signal terminal and the first signal-carrying via comprise a topside RF input terminal and an RF input via, respectively.

3. The microelectronic package of claim 2, wherein the coaxially-shielded RF I/O interface further comprises:
   a topside RF output terminal accessible from the package topside surface;
   a second topside ground terminal accessible from the package topside surface;
   an RF output via embedded within the package body to electrically couple the RF circuitry to the topside RF output terminal; and
   a second coaxial shield structure electrically coupled to the second topside ground terminal and extending at least partially around an outer periphery of the RF output via.

4. The microelectronic package of claim 3, further comprising a first interposer piece embedded in the package body and within which the RF input via extends.

5. The microelectronic package of claim 4, further comprising at least one of a filter circuit and an impedance matching network formed in the first interposer piece and electrically coupled to the first signal-carrying via.

6. The microelectronic package of claim 4, further comprising a second interposer piece embedded in the package body and in which the RF output via extends, the second interposer piece spaced from the first interposer piece along an axis perpendicular to the package height direction.

7. The microelectronic package of claim 6, wherein the RF circuitry comprises a power amplifier die located between first interposer piece and the second interposer piece, as taken along the axis.

8. The microelectronic package of claim 4, wherein the RF output via further extends in the first interposer piece; and
   wherein the first interposer piece extends from a location adjacent a first sidewall of the package body to a location adjacent a second opposing sidewall of the package body.

9. The microelectronic package of claim 8, wherein the first interposer piece has a ring-shaped or U-shaped planform geometry and extends at least partially around an outer periphery of the package body.

10. The microelectronic package of claim 1, further comprising an interposer piece embedded in the package body, the first signal-carrying via and the first coaxial shield structure formed in the interposer piece.

11. The microelectronic package of claim 10, wherein the interposer piece comprises:
    a dielectric interposer body;
    an upper interposer bond pad formed on an upper surface of the dielectric interposer body, the upper interposer bond pad exposed through the package topside surface to define the first topside RF signal terminal; and
    a lower interposer bond pad formed on a lower surface of the dielectric interposer body opposite the upper surface of the dielectric interposer body, the lower interposer bond pad electrically coupled to the upper interposer bond pad by the first signal-carrying via.

12. The microelectronic package of claim 11, further comprising a package substrate including:
    a populated side to which the RF circuitry is attached;
    a substrate bond pad located on the populated side of the RF circuitry and bonded to the lower interposer bond pad; and
    a substrate transmission line joined to the substrate bond pad and extending away therefrom.

13. The microelectronic package of claim 12, wherein the substrate transmission line comprises a tapered section increasing in width when moving from the substrate bond pad toward the RF circuitry.

14. The microelectronic package of claim 10, wherein the interposer piece comprises a multilayer printed circuit board in which the first signal-carrying via and the first coaxial shield structure are formed.

15. The microelectronic package of claim 1, wherein the first coaxial shield structure comprises a plurality of ground vias angularly spaced about the outer periphery of the first signal-carrying via to form a grounded via cage.

16. The microelectronic package of claim 15, wherein the plurality of ground vias comprises at least three ground vias angularly spaced about the outer periphery of the first signal-carrying via to provide a cumulative shielding angle of at least 180 degrees.

17. The microelectronic package of claim 1, wherein the first coaxial shield structure comprises
    a first ground via electrically coupling the first, second, and third ground plane layers.

18. The microelectronic package of claim 17, further comprising an interposer piece in which the first and second ground plane layers are formed;
    wherein the interposer piece comprises a first dielectric layer through which the first ground via extends to electrically couple the first, second, and third ground plane layers.

19. The microelectronic package of claim 1, wherein the first, second, and third ground plane layers each comprise an opening substantially concentric with the first signal-carrying via.

20. The microelectronic package of claim 1, wherein the first, second, and third ground plane layers comprise first, second, and third openings, respectively, through which the first signal-carrying via extends; and
wherein the first, second, and third openings vary in planform shape or in planform dimensions.

21. A microelectronic package, comprising:
a package body having a package topside surface at a top exterior surface of the package body and a package bottomside surface opposite the package topside surface, as taken along in a package height direction;
a topside input/output (I/O) interface accessible from the package topside surface external to the microelectronic package, the topside I/O interface including a topside radio frequency (RF) input terminal and a topside RF output terminal;
an RF power die contained in the package body, below the package topside surface, the RF power die having a die input terminal and a die output terminal;
a signal input via electrically coupling the die input terminal to the topside RF input terminal;
a signal output via electrically coupling the die output terminal to the topside RF output terminal; and
first and second coaxial shield arrangements extending at least partially around an outer periphery of the signal input via and at least partially around an outer periphery of the signal output via, respectively, to inhibit electromagnetic interference (EMI) with RF signals carried by the signal input via and by the signal output via during operation of the microelectronic package, wherein the first coaxial shield structure includes a first ground plane layer formed adjacent the topside RF signal terminal, a second ground plane layer formed below the first ground plane layer, and a third ground plane layer formed below the first ground plane layer and between the first and second ground plane layers.

* * * * *